United States Patent
Lin et al.

(10) Patent No.: US 12,520,574 B2
(45) Date of Patent: Jan. 6, 2026

(54) SEMICONDUCTOR DEVICE STRUCTURE INCLUDING FORKSHEET TRANSISTORS AND METHODS OF FORMING THE SAME

(71) Applicant: TAIWAN SEMICONDUCTOR MANUFACTURING COMPANY, LTD., Hsinchu (TW)

(72) Inventors: Ta-Chun Lin, Hsinchu (TW); Chih-Hung Hsieh, Hsinchu (TW); Chun-Sheng Liang, Changhua (TW); Wen-Chiang Hong, Taipei (TW); Chun-Wing Yeung, Hsinchu (TW); Kuo-Hua Pan, Hsinchu (TW); Chih-Hao Chang, Hsinchu (TW); Jhon Jhy Liaw, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 430 days.

(21) Appl. No.: 18/097,263

(22) Filed: Jan. 15, 2023

(65) Prior Publication Data
US 2024/0120337 A1  Apr. 11, 2024

Related U.S. Application Data

(60) Provisional application No. 63/414,535, filed on Oct. 9, 2022.

(51) Int. Cl.
*H01L 27/092* (2006.01)
*H01L 21/8238* (2006.01)
(Continued)

(52) U.S. Cl.
CPC ........... *H10D 84/85* (2025.01); *H10D 30/014* (2025.01); *H10D 30/43* (2025.01);
(Continued)

(58) Field of Classification Search
CPC ...... H10D 84/85; H10D 30/014; H10D 30/43; H10D 30/6735; H10D 62/121;
(Continued)

(56) References Cited

U.S. PATENT DOCUMENTS 9,209,247 B2  12/2015  Colinge et al.
9,236,267 B2  1/2016  De et al.
(Continued)

*Primary Examiner* — Tong-Ho Kim
(74) *Attorney, Agent, or Firm* — Cooper Legal Group, LLC

(57) ABSTRACT

A semiconductor device structure includes a first dielectric wall, a plurality of first semiconductor layers vertically stacked and extending outwardly from a first side of the first dielectric wall, each first semiconductor layer has a first width, a plurality of second semiconductor layers vertically stacked and extending outwardly from a second side of the first dielectric wall, each second semiconductor layer has a second width, a plurality of third semiconductor layers disposed adjacent the second side of the first dielectric wall, each third semiconductor layer has a third width greater than the second width, a first gate electrode layer surrounding at least three surfaces of each of the first semiconductor layers, the first gate electrode layer having a first conductivity type, and a second gate electrode layer surrounding at least three surfaces of each of the second semiconductor layers, the second gate electrode layer having a second conductivity type opposite the first conductivity type.

20 Claims, 27 Drawing Sheets

(51) Int. Cl.
     *H01L 29/06*    (2006.01)
     *H01L 29/423*   (2006.01)
     *H01L 29/66*    (2006.01)
     *H01L 29/775*   (2006.01)
     *H10D 30/01*    (2025.01)
     *H10D 30/43*    (2025.01)
     *H10D 30/67*    (2025.01)
     *H10D 62/10*    (2025.01)
     *H10D 84/01*    (2025.01)
     *H10D 84/03*    (2025.01)
     *H10D 84/85*    (2025.01)

(52) U.S. Cl.
     CPC ....... *H10D 30/6735* (2025.01); *H10D 62/121* (2025.01); *H10D 84/0167* (2025.01); *H10D 84/038* (2025.01)

(58) Field of Classification Search
     CPC ............. H10D 84/0167; H10D 84/038; H10D 30/6757; H10D 84/0177
     USPC ......................................................... 257/351
     See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2022/0102520 A1* | 3/2022 | Shiliang ............. H10D 30/6757 |
| 2022/0139914 A1* | 5/2022 | Cheng ................ H10D 30/6735 257/288 |
| 2022/0302275 A1* | 9/2022 | Yu ....................... H10D 30/6757 |

* cited by examiner

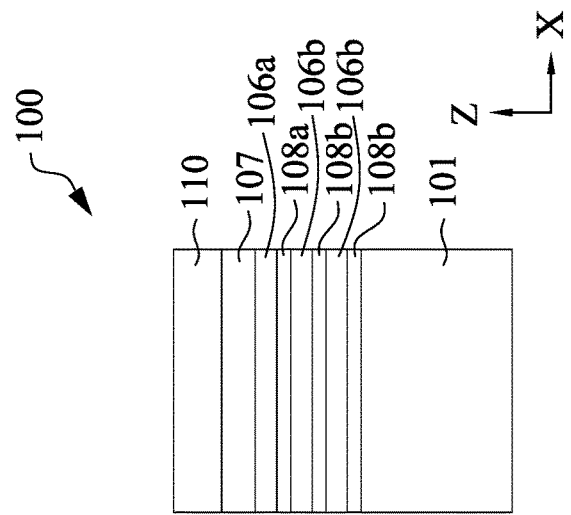
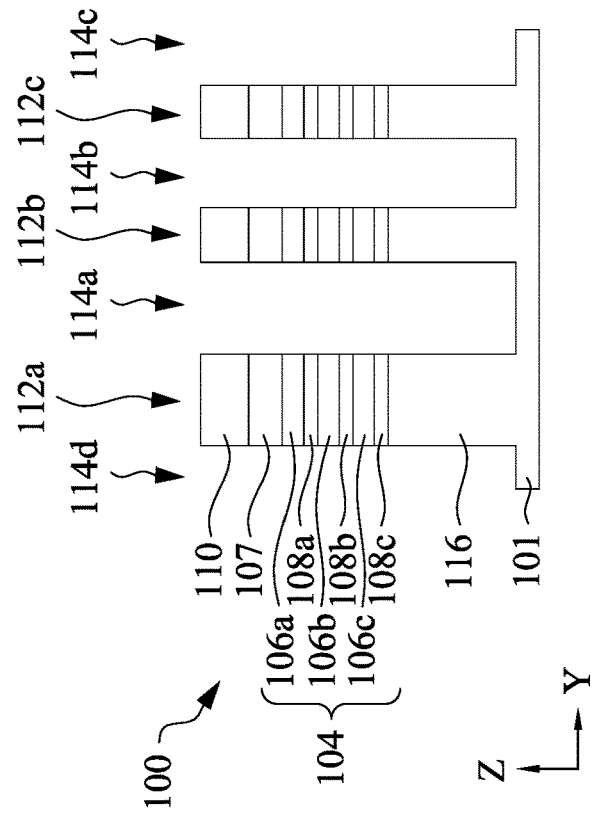
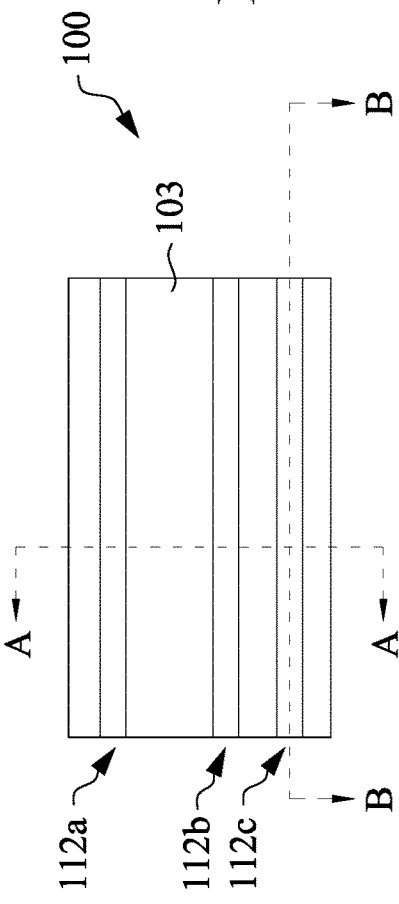
FIG. 3A
FIG. 3B
FIG. 3C

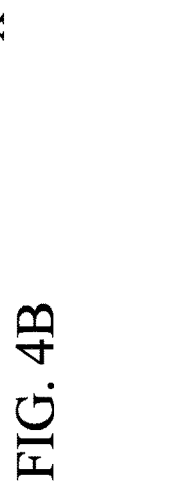
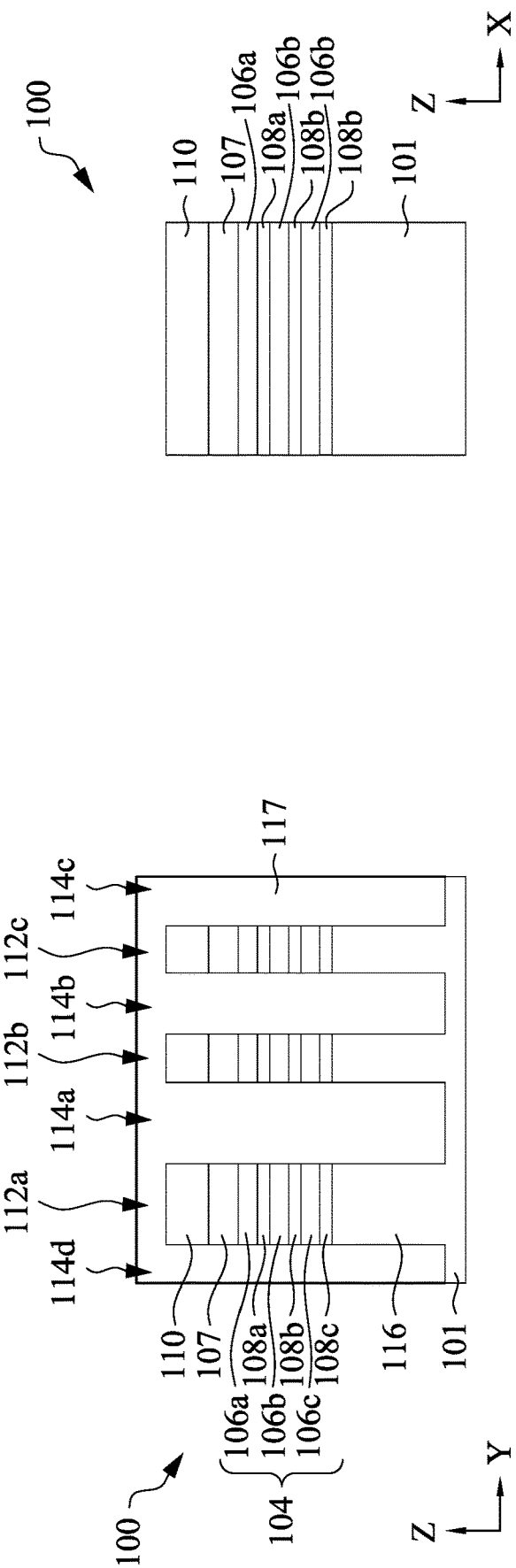
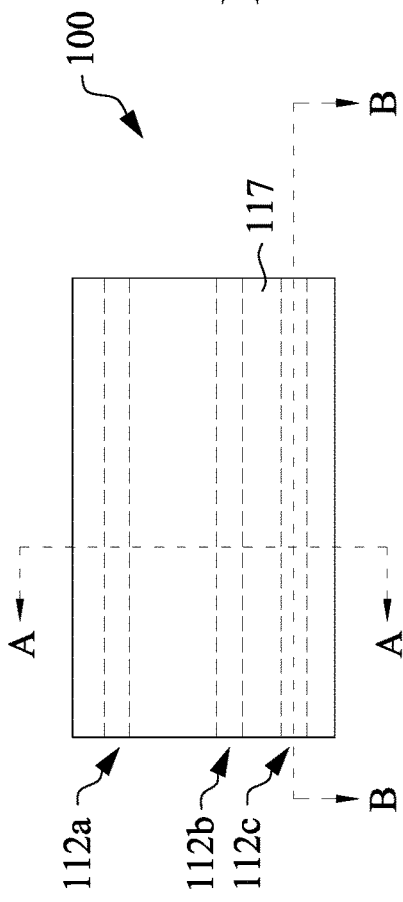
FIG. 4B
FIG. 4A
FIG. 4C

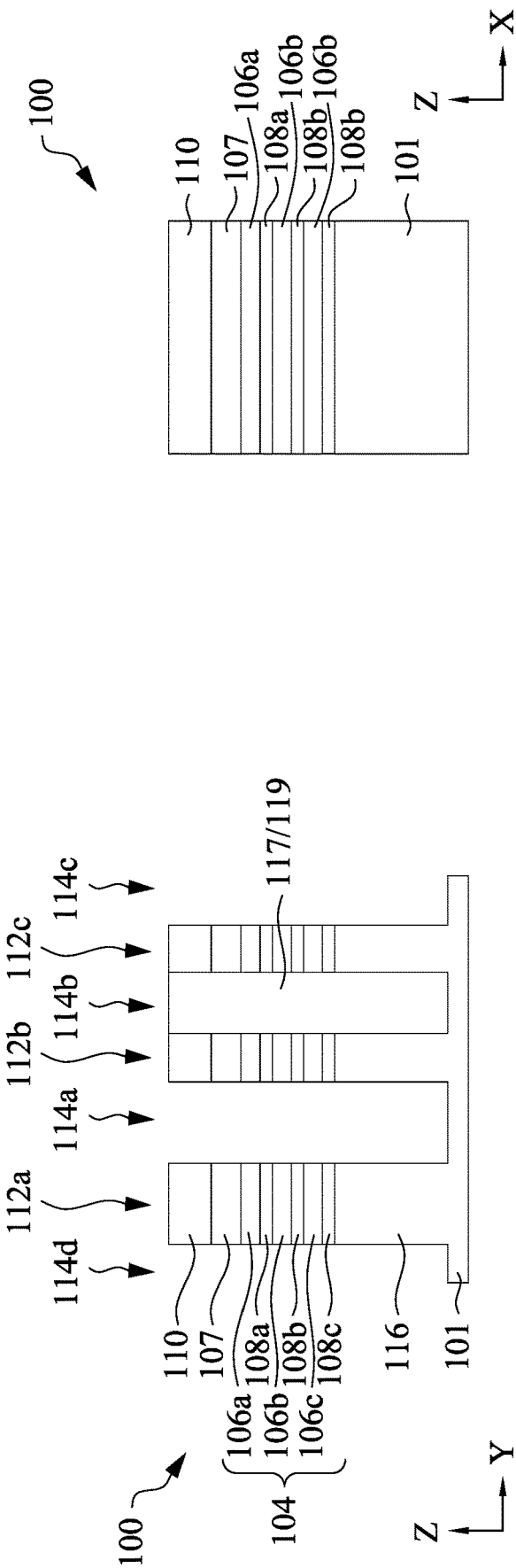
FIG. 5A
FIG. 5C
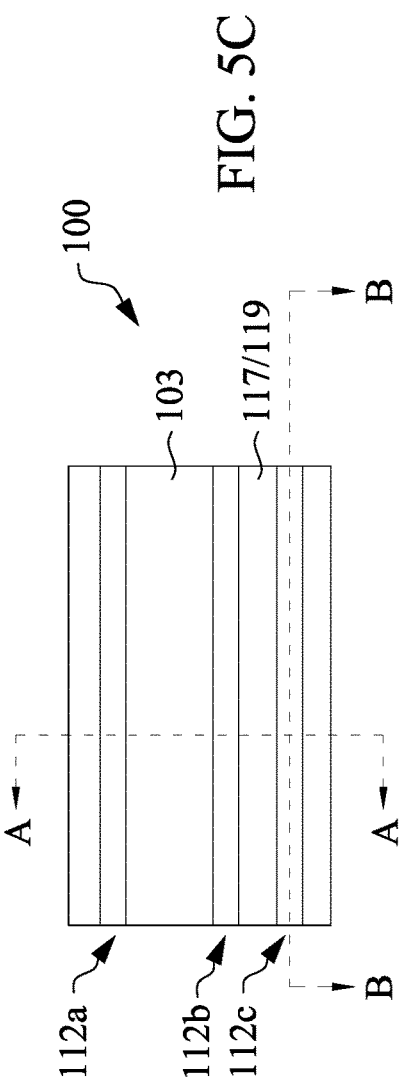
FIG. 5B

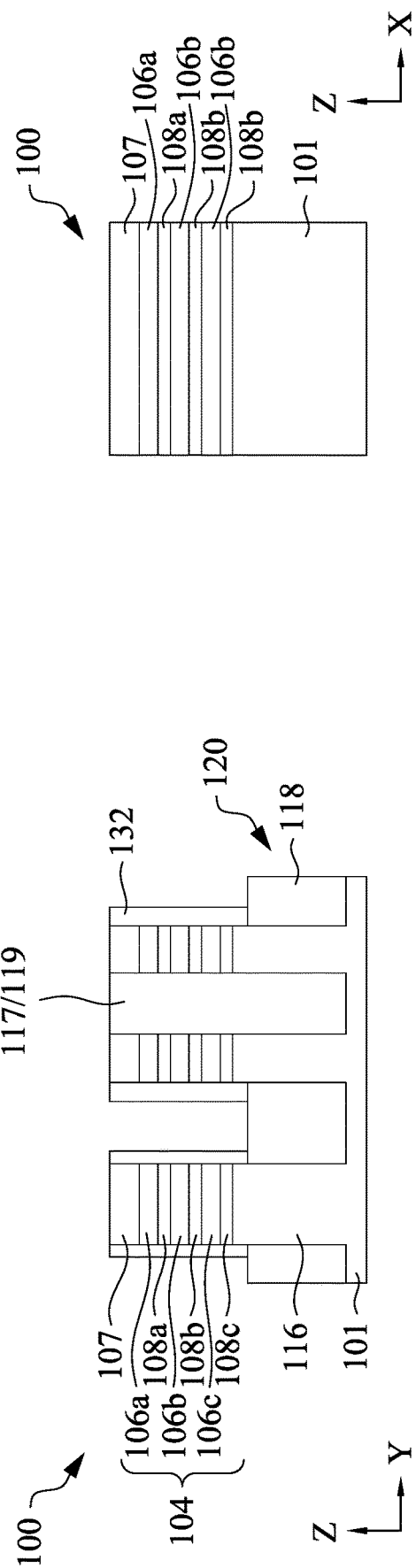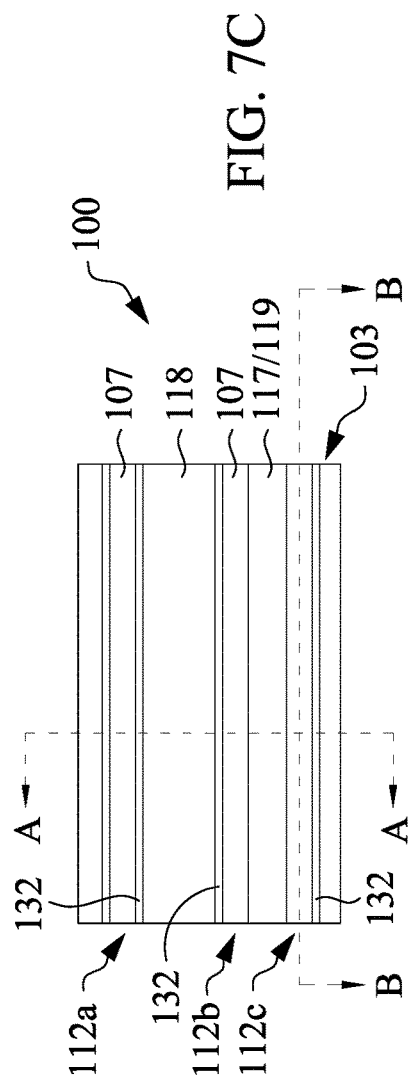
FIG. 7A
FIG. 7B
FIG. 7C

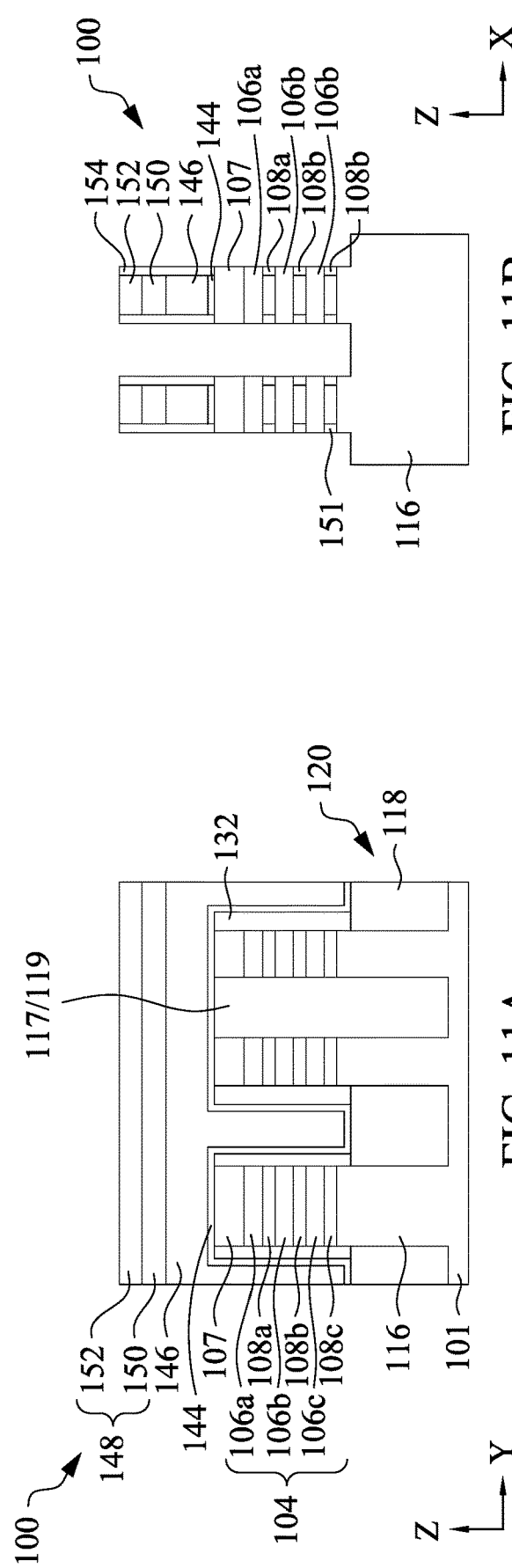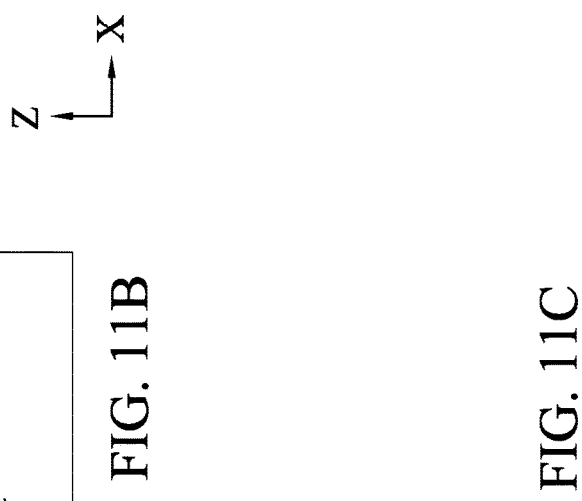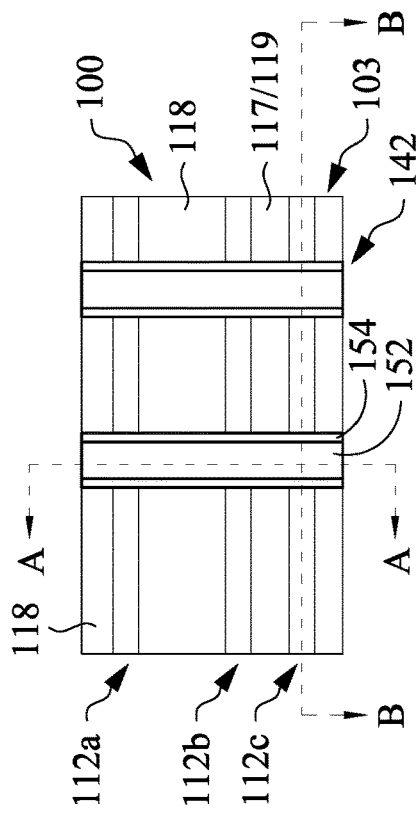
FIG. 11A
FIG. 11B
FIG. 11C

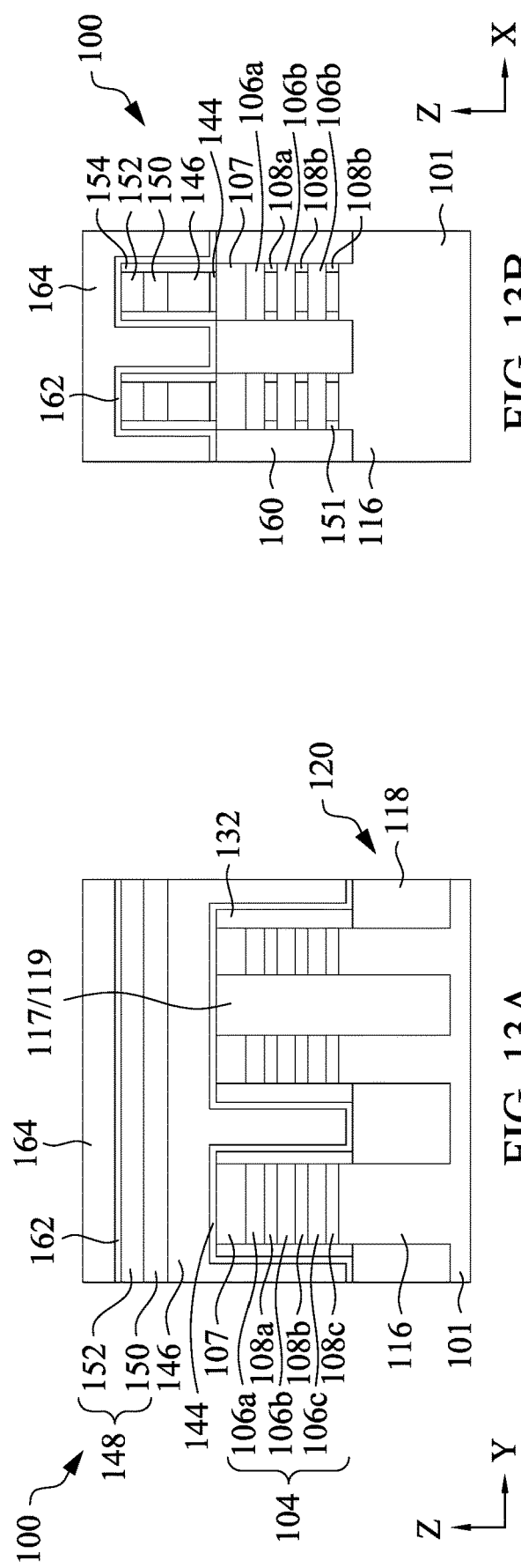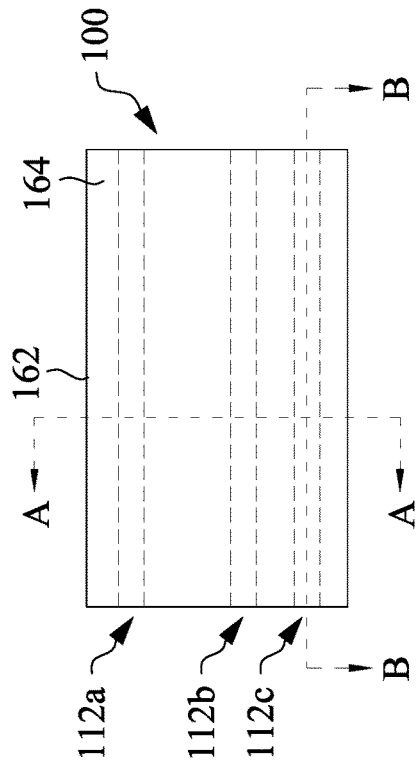
FIG. 13A
FIG. 13B
FIG. 13C

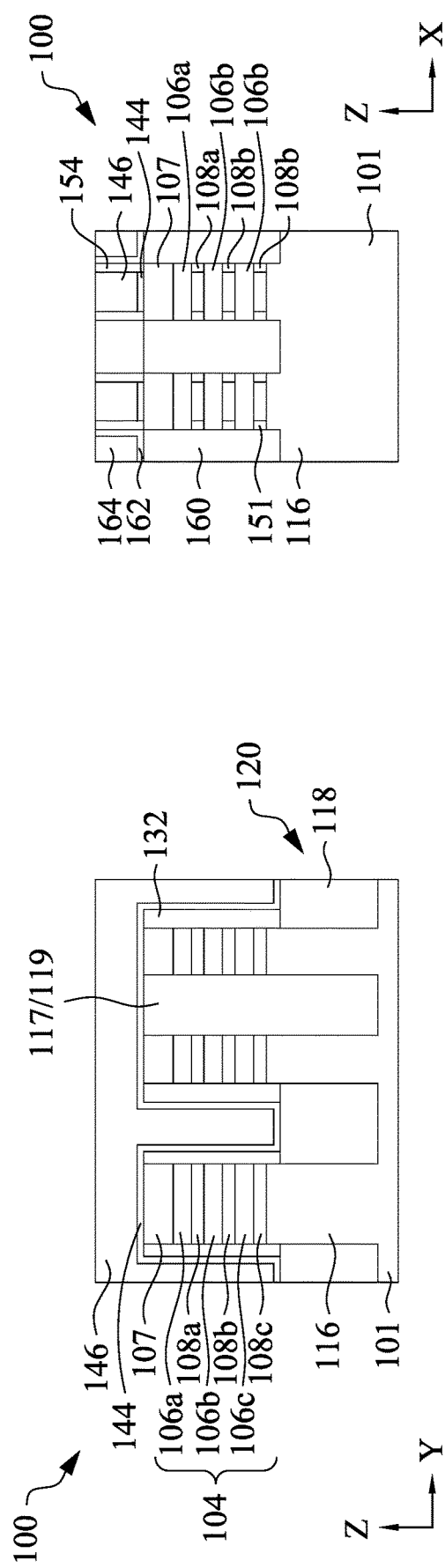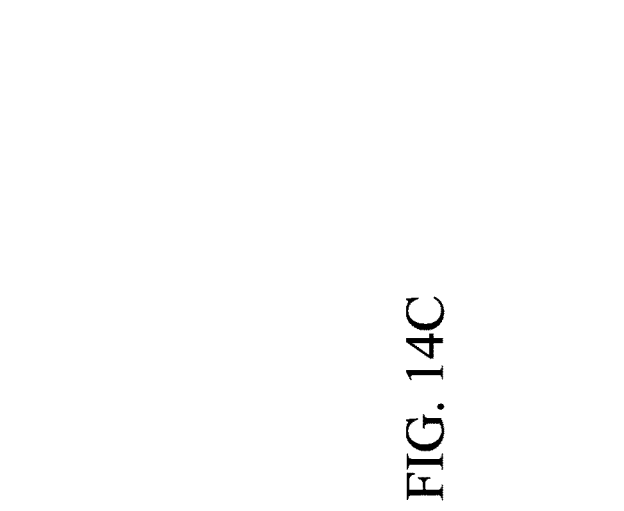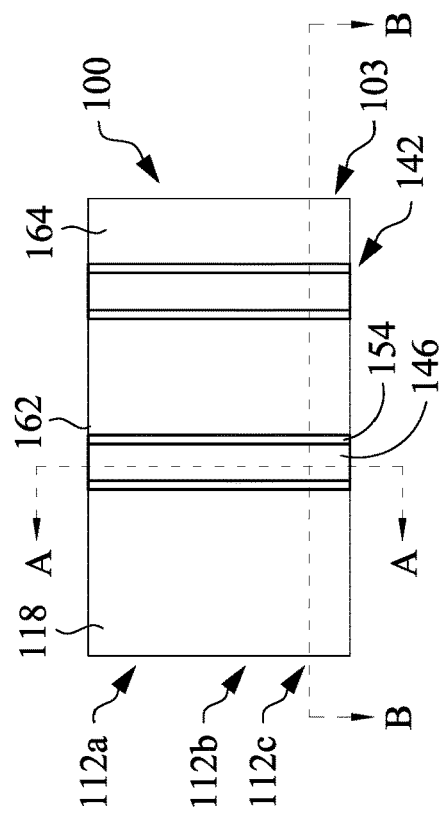
FIG. 14A
FIG. 14B
FIG. 14C

SEMICONDUCTOR DEVICE STRUCTURE INCLUDING FORKSHEET TRANSISTORS AND METHODS OF FORMING THE SAME

CROSS-REFERENCE TO RELATED APPLICATIONS

This application claims priority to U.S. Provisional Application Ser. No. 63/414,535 filed Oct. 9, 2022, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenge. For example, transistors using nanowire channels have been proposed to achieve increased device density, greater carrier mobility and drive current in a device. As device size reduces, there is a continuous need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-14A are cross-sectional side views of various stages of manufacturing the semiconductor device structure taken along line A-A of FIG. 3C, in accordance with some embodiments.

FIGS. 3B-14B are cross-sectional side views of various stages of manufacturing the semiconductor device structure taken along line B-B of FIG. 3C, in accordance with some embodiments.

FIGS. 3C-14C are top views of the semiconductor device structure of FIG. 2 in accordance with some embodiments.

FIG. 9 is a perspective view of one of the various stages of manufacturing the semiconductor device structure, in accordance with some embodiments.

FIG. 18-1 illustrates a cross-sectional view of the semiconductor device structure in accordance with some embodiments.

DETAILED DESCRIPTION

Figure 1:
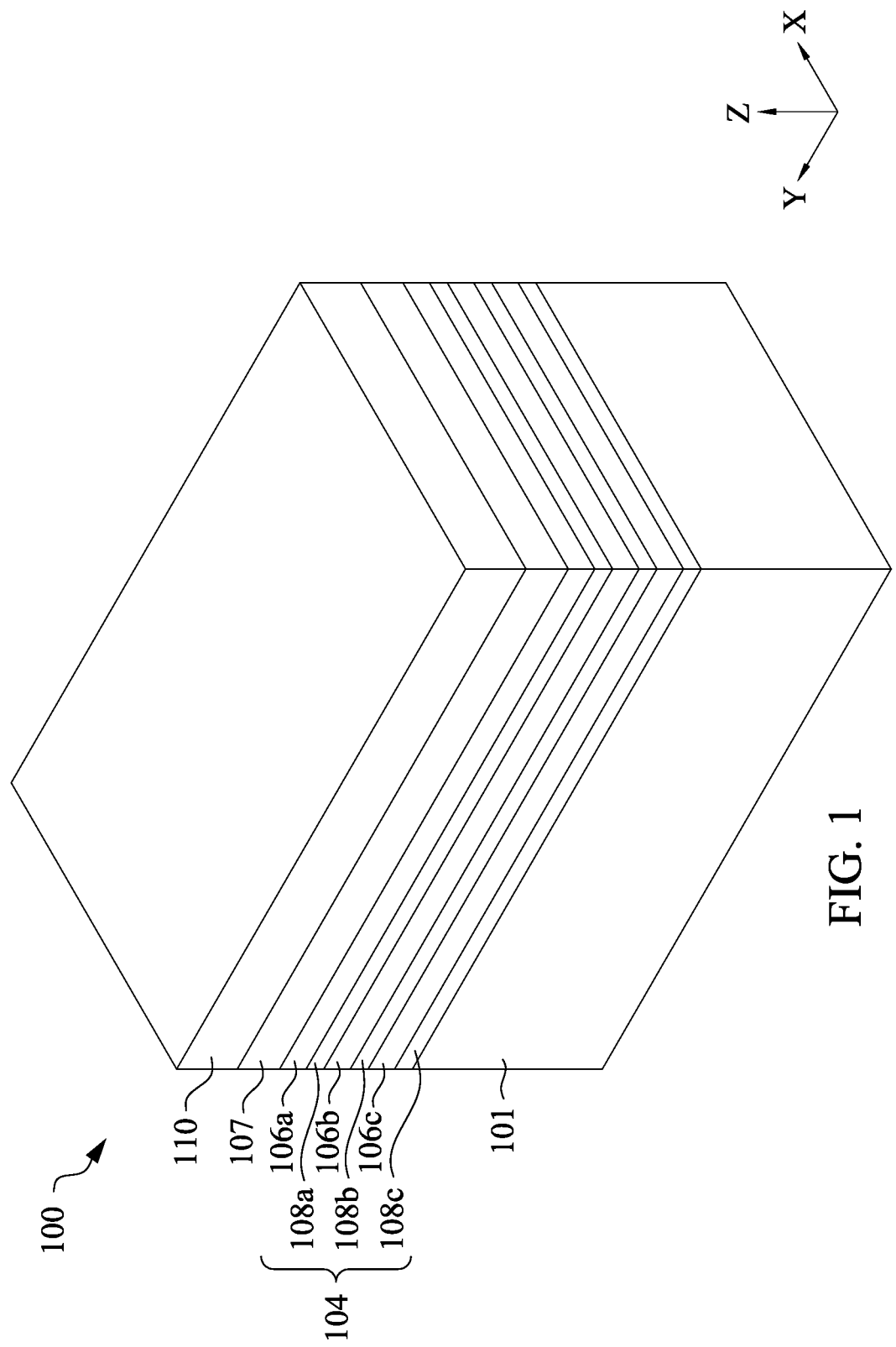
FIGS. 1-2 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-26 show exemplary sequential processes for manufacturing a semiconductor device structure 100, in accordance with some embodiments. It is understood that additional operations can be provided before, during, and after processes shown by FIGS. 1-26, and some of the operations described below can be replaced or eliminated, for additional embodiments of the method. The order of the operations/processes may be interchangeable.

FIG. 1 is a perspective view of one of various stages of manufacturing the semiconductor device structure 100, in accordance with some embodiments. As shown in FIG. 1, a semiconductor device structure 100 includes a stack of semiconductor layers 104 formed over a front side of a substrate 101. The substrate 101 may be a semiconductor substrate. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 101 is made of Si. In some embodiments, the substrate 101 is a silicon-on-insulator (SOI) substrate, which includes an insulating layer (not shown) disposed between two silicon layers. In one aspect, the insulating layer is an oxide.

The substrate 101 may include various regions that have been doped with impurities (e.g., dopants having p-type or n-type conductivity). Depending on circuit design, the dopants may be, for example boron for a p-type (or p-channel) field effect transistor (FET) and phosphorus for an n-type (or n-channel) FET.

The stack of semiconductor layers 104 includes alternating semiconductor layers made of different materials to facilitate formation of nanosheet channels in a multi-gate device, such as nanosheet channel FETs or forksheet FETs. In some embodiments, the stack of semiconductor layers 104 includes first semiconductor layers 106 (106a-106c) and second semiconductor layers 108 (108a-108c). In some embodiments, the stack of semiconductor layers 104 includes alternating first and second semiconductor layers 106, 108. The first semiconductor layers 106 are aligned with the second semiconductor layers 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. In some cases, the SiGe in the first or second semiconductor layers 106, 108 can have a germanium composition percentage between about 10% and about 80%. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first semiconductor layers 106 or portions thereof may form nanosheet channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by a gate electrode. For example, the nanosheet channel(s) of a forksheet transistor may have at least three surfaces surrounded by the gate electrode. The semiconductor device structure 100 may include a nanosheet transistor and/or a forksheet transistor. The nanosheet transistors may be referred to as nanowire transistors, gate-all-around (GAA) transistors, multi-bridge channel (MBC) transistors, or any transistors having the gate electrode surrounding the channels.

It is noted that while three layers of the first semiconductor layers 106 and three layers of the second semiconductor layers 108 are alternately arranged as illustrated in FIG. 1, it can be appreciated that any number of first and second semiconductor layers 106, 108 can be formed in the stack of semiconductor layers 104, depending on the predetermined number of channels for the semiconductor device structure 100. In some embodiments, the number of first semiconductor layers 106, which is the number of channels, is between 2 and 8.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

The substrate 101 may include a sacrificial layer 107 on the stack of semiconductor layers 104. The sacrificial layer 107 protects the stack of semiconductor layers 104 during the subsequent processes and is removed along with a portion of a cladding layer (FIG. 7A) prior to formation of the sacrificial gate stack (FIG. 8). In cases where the first semiconductor layer 106 of the stack of semiconductor layers 104 is Si, the sacrificial layer 107 includes SiGe epitaxially grown on the first semiconductor layer 106.

Each first semiconductor layer 106 may have a thickness in a range between about 5 nm and about 30 nm. Each second semiconductor layer 108 may have a thickness that is equal, less, or greater than the thickness of the first semiconductor layer 106. In some embodiments, each second semiconductor layer 108 has a thickness in a range between about 2 nm and about 50 nm. The second semiconductor layers 108 may eventually be removed and serve to define a vertical distance between adjacent channels for the semiconductor device structure 100. The sacrificial layer 107 may have a thickness that is equal, less, or greater than the thickness of the first semiconductor layer 106. The thickness of the sacrificial layer 107 may range from about 2 nm to 50 nm. The thickness of the first semiconductor layer 106, the second semiconductor layer 108, and the sacrificial layer 107 may vary depending on the application and/or device performance considerations.

A mask structure 110 is formed over the sacrificial layer 107. The mask structure 110 may include an oxygen-containing layer and a nitrogen-containing layer. The oxygen-containing layer may be a pad oxide layer, such as a $SiO_2$ layer. The nitrogen-containing layer may be a pad nitride layer, such as $Si_3N_4$. The mask structure 110 may be formed by any suitable deposition process, such as chemical vapor deposition (CVD) process.

Figure 2:
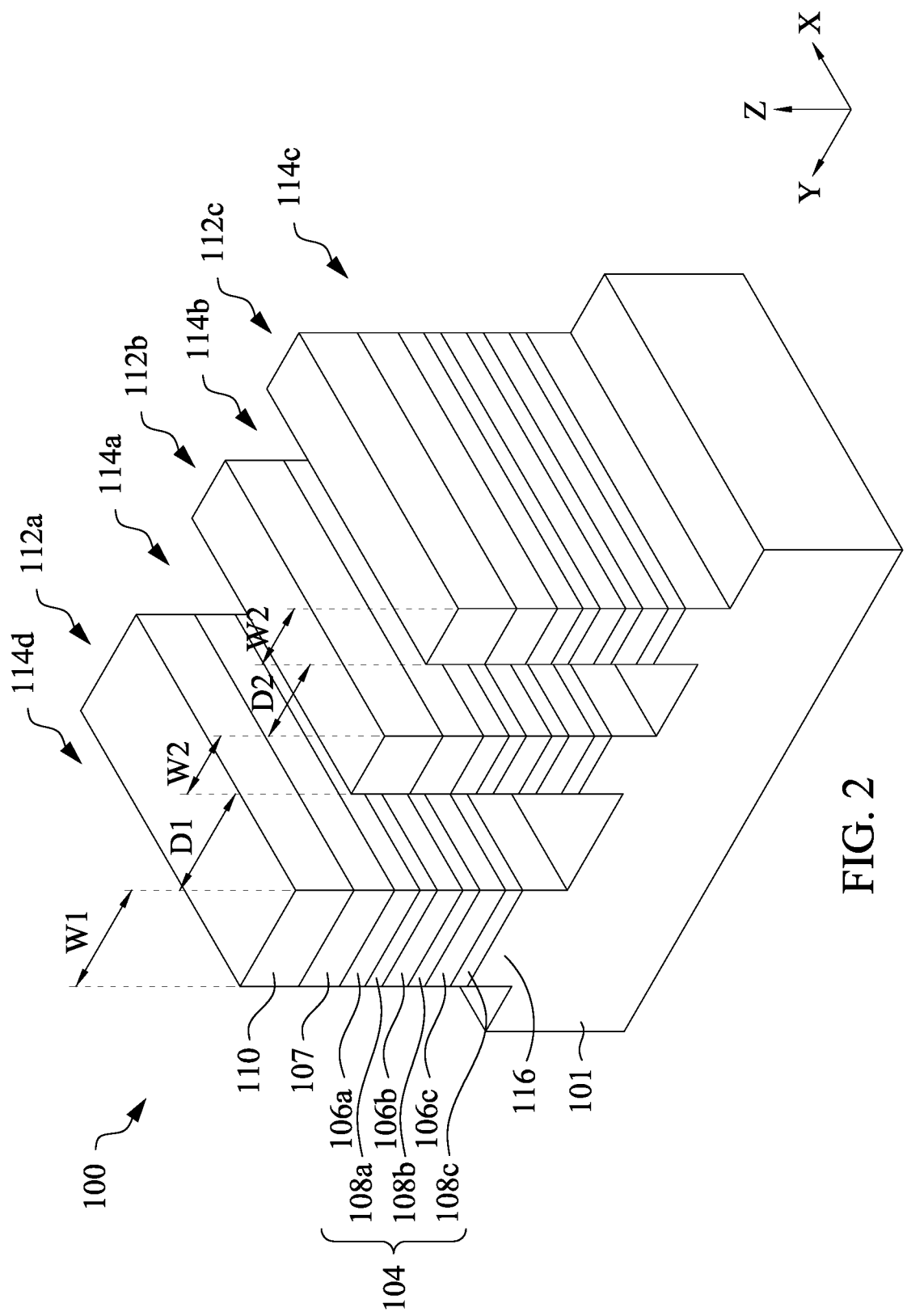

FIG. 2 is a perspective view of one of the various stages of manufacturing the semiconductor device structure 100, in accordance with some embodiments. Fin structures 112 (112a-112c) are formed from the stack of semiconductor layers 104. Each fin structure 112 has an upper portion including the semiconductor layers 106, 108 and a well portion 116 formed from the substrate 101. The fin structures 112 may be fabricated using multi-patterning operations including photo-lithography and etching processes. The etching process can include dry etching, wet etching, reactive ion etching (RIE), and/or other suitable processes. The etching process forms trenches 114 (e.g., 114a, 114b, 114c, 114d) in unprotected regions through the mask structure 110, through the stack of semiconductor layers 104, and into the substrate 101, thereby leaving the plurality of extending fin structures 112 (e.g., 112a, 112b, 112c). The trenches 114 extend along the X direction. The trenches 114 may be etched using a dry etch (e.g., RIE), a wet etch, and/or combination thereof.

As shown in FIG. 2, the fin structure 112a may have a width W1, and the fin structures 112b, 112c may each has a width W2. The width W2 may be equal, less, or greater than the width W1. In one embodiment shown in FIG. 2, the width W1 is greater than the width W2. The widths W1, W2 may correspond to the device's channel width. In one embodiment, the width W1 is in a range between 5 nm to about 120 nm, for example about 10 nm to about 100 nm. In various embodiments, the width W1 may be about 1.3 times or greater than the width W2. In one embodiment, the width W1 is about 1.5 to about 10 times greater than the width W2.

The distance between adjacent fin structures may be defined by the distance between a first sidewall of one fin structure and a second sidewall of the adjacent fin structure facing the first sidewall. For example, the fin structure 112a and the fin structure 112b are separated by a distance D1. The fin structure 112b and the fin structure 112c are separated by a distance D2. The distances D1, D2 may vary depending on the layouts of the fin structures in a SRAM cell. The width of the fin structures 112a, 112b, 112c may also vary depending on the channel width of the devices needed in the semiconductor device structure 100. The devices with a wider channel, such as the devices to be fabricated from the fin structures 112a, 112b, may be more suitable for high-speed applications, such as a NAND device or high-performance computing (HPC). The devices with a narrower channel, such as the device fabricated from the fin structures 112b, 112c, may be more suitable for low-power and low-leakage applications, such as an inverter device or system-on-chip (SOC). Therefore, trenches with wider width (e.g., trench 114a) may be formed in regions where devices/transistors require higher voltage current and/or higher performance, while trenches with narrower width (e.g., trench 114b) may be formed in regions where greater density of devices/transistors is desired.

In one embodiment shown in FIG. 2, the first distance D1 is greater than the second distance D2. The distance D2 defines the width of the subsequent dielectric walls 119 (FIG. 5A). The second distance D2 may be in a range from about 2 nm to about 40 nm, for example about 3 nm to about 30 nm. With the smaller distance D2 (i.e., reduced fin-to-fin spacing) between the fin structures 112b and 112c, a subsequent insulating material 117 (FIG. 4A) may completely fill in the trench 114b before the insulating material 117 fills up the trenches 114a, 114c, 114d. That is, trench 114a (and trenches 114c and 114d) remains open after the deposition of the insulating material 117 due to the wider distance D1. The insulating material 117 (later become dielectric wall 119) between the fin structures 112a and 112b allows the nanosheet channels to attach to both sides of the dielectric wall 119 and form forksheet transistors. The reduced fin-to-fin spacing and fork-like nanosheet transistors enable greater device density (even with greater channel width) and superior area and performance scalability.

Depending on the layouts of the SRAM cell, the trenches 114c and 114d may have a width corresponding to the first distance D1 or the second distance D2. In one embodiment shown in FIG. 2, the trenches 114c, 114d have a width corresponding to the first distance D1. In some embodiments, a fin structure (not shown) having a width corresponding to W1 may be disposed adjacent to and spaced apart the fin structure 112a by the trench 114d. Likewise, a fin structure (not shown) having a width corresponding to W2 may be disposed adjacent to and spaced apart the fin structure 112c by the trench 114c.

FIGS. 3C-14C are top-views of the semiconductor device structure 100 of FIG. 2, which may represent a portion of the layout of active fin structures in a SRAM cell 103. For example, a 6T SRAM cell may include two pull-up (PU) transistors, two pass-gate (PG) transistors, and two pull-down (PD) transistors. In one embodiment shown in FIGS. 3C-14C, the fin structures 112b and 112c can be used to form PU transistors and the fin structure 112a can be used to form PD transistor or PG transistor in the 6T SRAM cell. FIGS. 3A-14A are cross-sectional side views of various stages of manufacturing the semiconductor device structure 100 taken along line A-A of FIG. 3C, in accordance with some embodiments. FIGS. 3B-14B are cross-sectional side views of various stages of manufacturing the semiconductor device structure 100 taken along line B-B of FIG. 3C, in accordance with some embodiments.

In FIGS. 4A-4C, a dielectric material 117 is formed in the trenches 114a-114d and over the top surface of the mask structure 110. The dielectric material 117 is deposited so that the fins 112a-c are embedded in the dielectric material 117. The dielectric material 117 may include, but are not limited to, $SiO_x$, SiN, SiON, SiCN, SiOCN, $AlSi_xO_y$, $Al_2O_3$, hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HfTaO), hafnium titanium oxide (HMO), lanthanum oxide (LaO), zirconium oxide (ZrO), zirconium silicon oxide (ZrSiO), titanium oxide (TiO), tantalum oxide ($Ta_2O_5$), yttrium oxide ($Y_2O_3$), any suitable low-k materials, any suitable high-k materials, or any combination thereof. The dielectric material 117 may be formed by any suitable process, such as a chemical vapor deposition (CVD), plasma enhanced CVD (PECVD), flowable CVD (FCVD), atomic layer deposition (ALD), or physical vapor deposition (PVD) process.

In FIGS. 5A-5C, a planarization operation, such as a chemical mechanical polishing (CMP) method, is performed such that the top of the sacrificial layers 107 is exposed. Next, a removal process is performed to remove the dielectric material 117 from the trenches 114a, 114c, and 114d. The removal process may be any suitable etch process, such as dry etch, wet, etch, or a combination thereof. The removal process may be selective etch processes that remove portions of dielectric material 117 but not the mask structure 110, the sacrificial layers 107, the first semiconductor layers 106, and the second semiconductor layers 108. Because the trenches 114a, 114c, 114d have a larger dimension (i.e., distance D1) in the Y direction compared to that of the trench 114b (FIG. 2), the etchant removes more of the dielectric material 117 in the trenches 114a, 114c, 114d than the dielectric material 117 in the trench 114b. As a result, the dielectric material 117 in the trenches 114a, 114c, 114d are etched at a faster rate than the etch rate of the dielectric material 117 in the trench 114b. The removal process is performed until the dielectric material 117 in the trenches 114a, 114c, 114d are completely etched away. As a result of the removal process, the dielectric material 117 on exposed surfaces of the semiconductor device structure 100 are removed except for the dielectric material 117 filled in the trench 114b, as shown in FIG. 5A. The dielectric material 117 remaining in the trench 114b becomes a dielectric wall 119. The dielectric wall 119 extends all the way down to the well portions 116 of the substrate 101. The dielectric wall 119 forms one dielectric wall that isolates adjacent active fin structures (e.g., fin structures 112b, 112c), which are to be formed as a forksheet transistor in a SRAM cell. While not shown, the top of the dielectric wall 119 may have a concave profile due to etching effects from the removal process on the dielectric material 117.

Figure 6B:
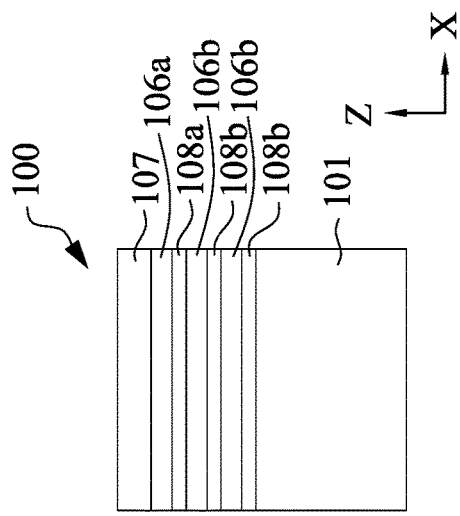
Figure 6A:
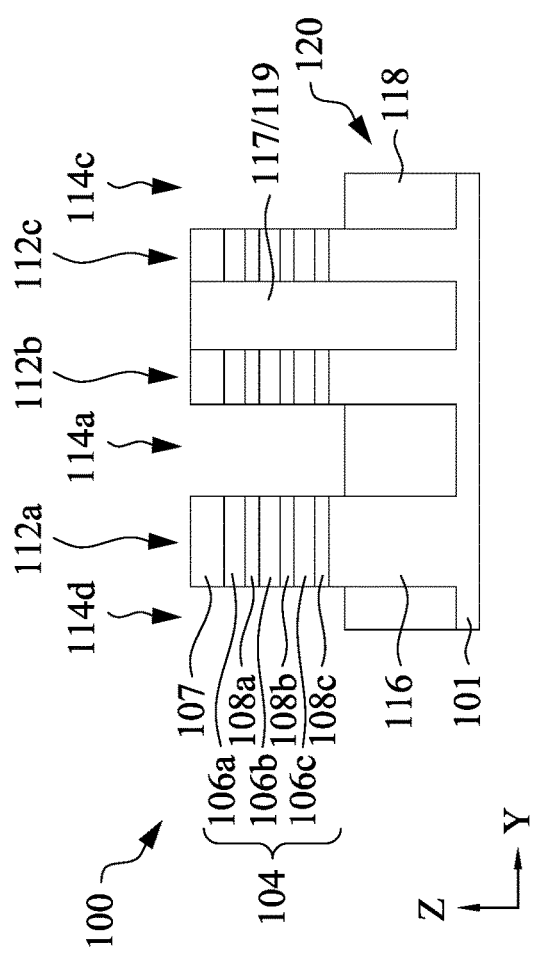
Figure 6C:
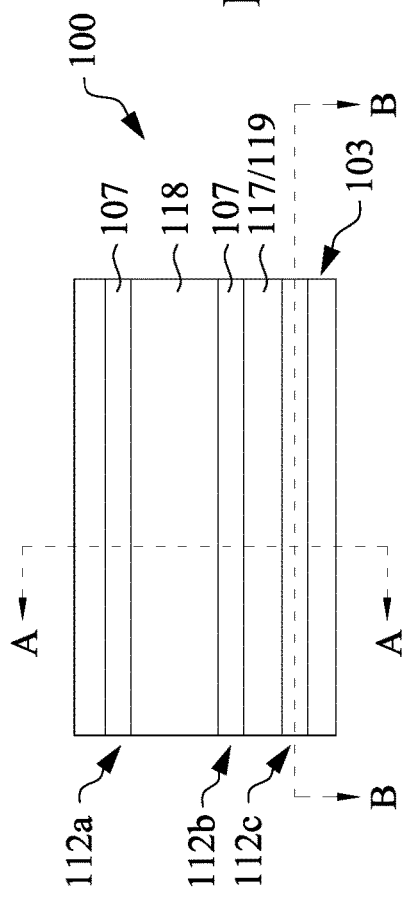

In FIGS. 6A-6C, an insulating material 118 is formed in the trenches 114a, 114d, 114c to form a shallow-trench isolation (STI) region 120. The insulating material 118 is first formed in the trenches 114a, 114d, 114c and over the dielectric wall 119. Then, a planarization operation, such as a CMP method, is performed such that the top of the sacrificial layer 107 or dielectric material 117 is exposed. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), PECVD or FCVD. Then, the insulating material 118 is recessed to form the STI region 120. The insulating material 118 may be recessed using an etch-back process or any suitable process, which can be a dry etching process, a wet etching process, or a combination thereof. The etch-back process is a selective etch process that removes portions of insulating material 118 but not the dielectric wall 119, the sacrificial layers 107, the first semiconductor layers 106, and the second semiconductor layers 108. The recess of the insulating material 118 reveals portions of the trenches 114a, 114d, 114c. In some embodiments, the insulating material 118 is recessed such that a top surface of the insulating material 118 is level with or slightly below a surface of the second semiconductor layers 108 (e.g., second semiconductor layer 108c) in contact with the well portion 116 formed from the substrate 101.

In FIGS. 7A-7C, a cladding layer 132 is formed on the sidewalls of the stack of semiconductor layers 104. The cladding layer 132 may be formed on the exposed surfaces of the stack of semiconductor layers 104, the sacrificial layer 107, the dielectric wall 119, and the isolation region 120. The cladding layer 132 may be formed by a conformal process, such as an ALD process. Next, portions of the cladding layer 132 are removed by an anisotropic etch process so that the cladding layer 132 on horizontal surfaces of the fin structures 112a, 112b, 112c (e.g., top surfaces of the sacrificial layer 107) and the insulating material 118 is removed. The removal process does not remove the cladding layer 132 formed on the vertical surfaces (e.g., the sidewalls) of the fin structures 112a, 112b, 112c and the sacrificial layer 107. The cladding layer 132 may have a thickness ranging from about 2 nm to about 20 nm, for example about 5 nm to about 13 nm. In some embodiments, the cladding layer 132 includes a semiconductor material. In some embodiments, the cladding layer 132 and the second semiconductor layers 108 are made of the same material having the same etch selectivity. For example, the cladding layer 132 and the second semiconductor layers 108 include SiGe. The cladding layer 132 and the second semiconductor layer 108 may be removed subsequently to create space for the gate electrode layer.

Figure 8A:
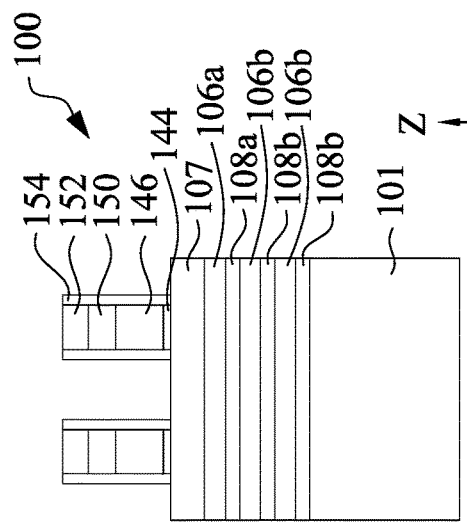
Figure 8B:
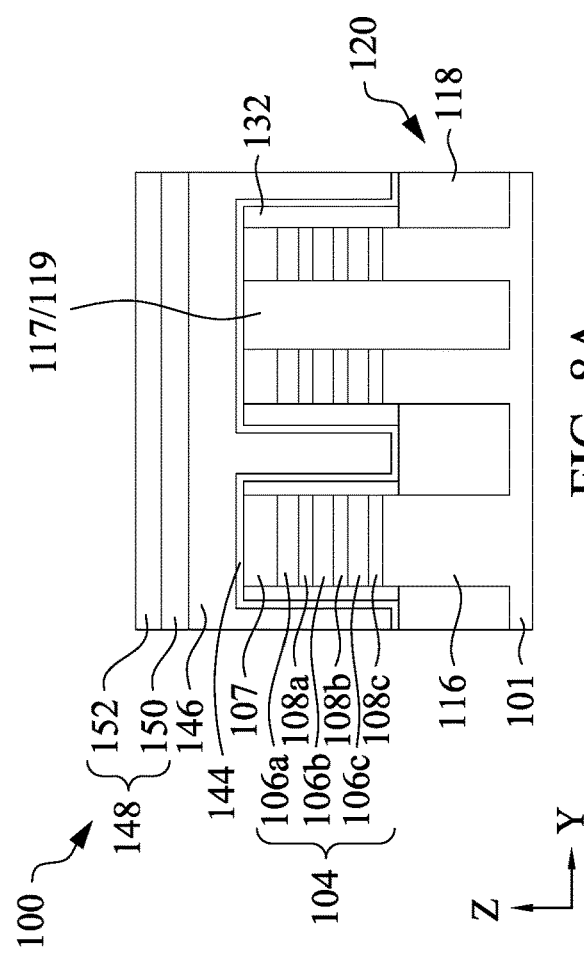
Figure 8C:
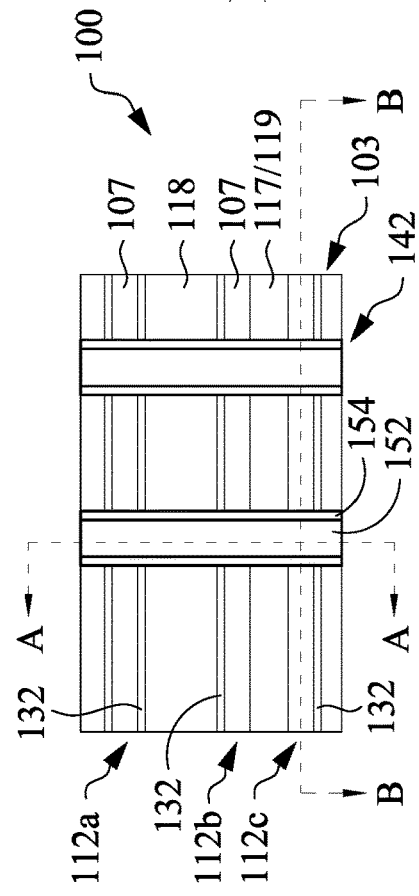
Figure 9:
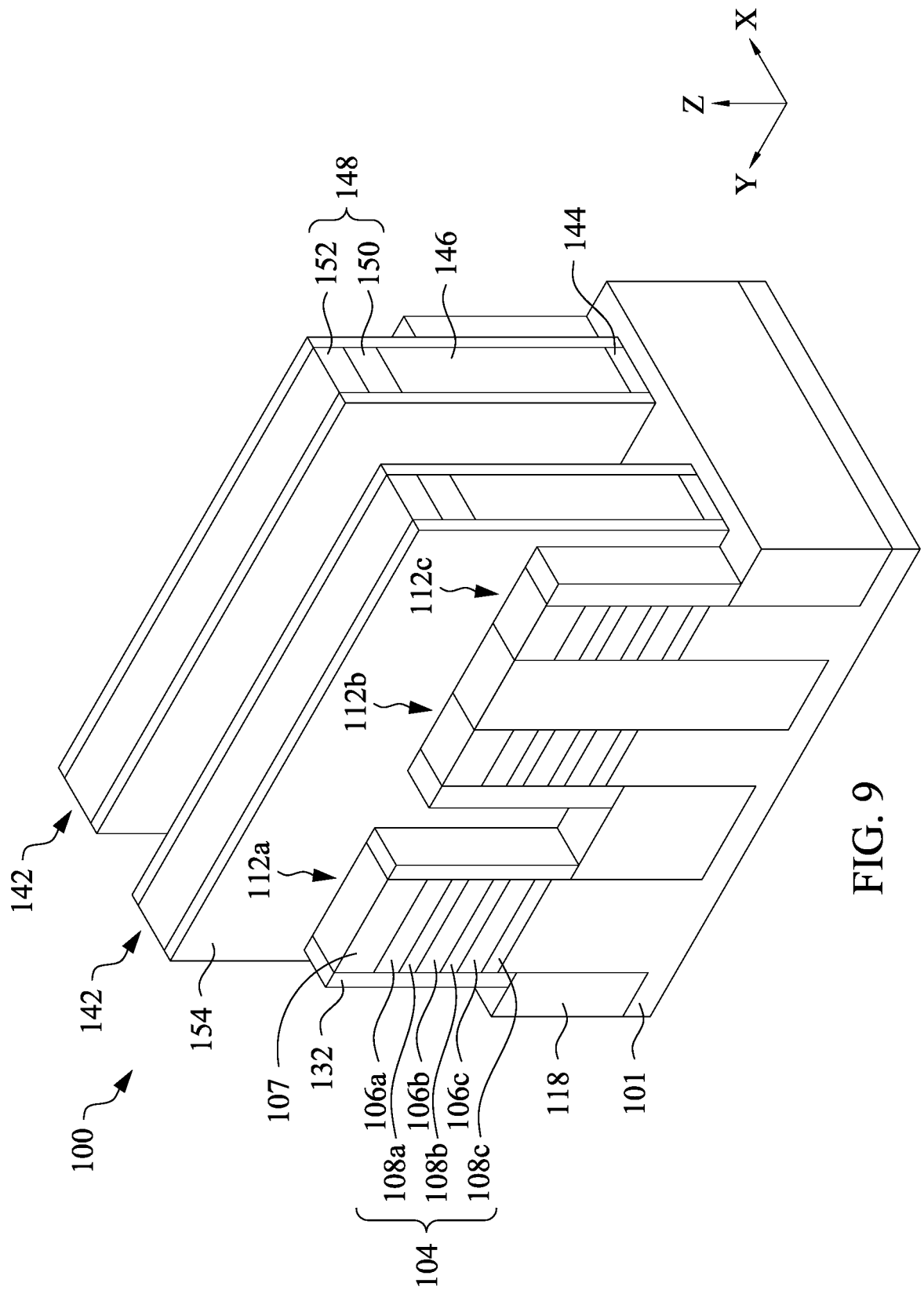

In FIGS. 8A-8C, one or more sacrificial gate stacks 142 are formed on the semiconductor device structure 100. FIG. 9 is a perspective view of one of various stages of manufacturing the semiconductor device structure 100, in accordance with some embodiments. As shown in FIGS. 8A-8C and 9, the sacrificial gate stacks 142 may each include a sacrificial gate dielectric layer 144, a sacrificial gate electrode layer 146, and a mask structure 148. The sacrificial gate dielectric layer 144 may include one or more layers of dielectric material, such as $SiO_2$, SiN, a high-k dielectric material, and/or other suitable dielectric material. In some embodiments, the sacrificial gate dielectric layer 144 may be deposited by a CVD process, a sub-atmospheric CVD (SACVD) process, a FCVD process, an ALD process, a PVD process, or other suitable process. The sacrificial gate electrode layer 146 may include polycrystalline silicon (polysilicon). The mask structure 148 may include an oxygen-containing layer 150 and a nitrogen-containing layer 152. The sacrificial gate electrode layer 146 and the mask structure 148 may be formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 142 may be formed by first depositing blanket layers of the sacrificial gate dielectric layer 144, the sacrificial gate electrode layer 146, and the mask structure 148, followed by pattern and etch processes. By patterning the sacrificial gate stack 142, the stacks of semiconductor layers 104 of the fins 112a, 112b, 112c are partially exposed on opposite sides of the sacrificial gate stack 142. While two sacrificial gate stacks 142 are shown, the number of the sacrificial gate stacks 142 is not limited to two. More than two sacrificial gate stacks 142 may be arranged along the X direction in some embodiments. Next, a spacer 154 is formed on sidewalls of the sacrificial gate stacks 142. The spacer 154 may be formed by first depositing a conformal layer (e.g., by an ALD process) that is subsequently etched back (e.g., by RIE) to form sidewall spacers 154. During the anisotropic etch process, most of the spacer 154 is removed from horizontal surfaces, such as the tops of the fin structures 112a, 112b, 112c, the cladding layers 132, leaving the spacers 154 on the vertical surfaces, such as the sidewalls of sacrificial gate stacks 142. The spacer 154 may be made of a dielectric material such as silicon oxide, silicon nitride, silicon carbide, silicon oxynitride, SiCN, silicon oxycarbide, SiOCN, and/or combinations thereof.

Figure 10B:
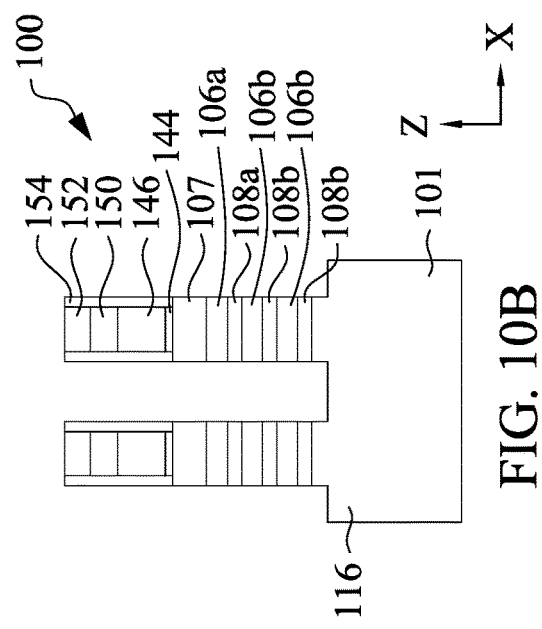
Figure 10A:
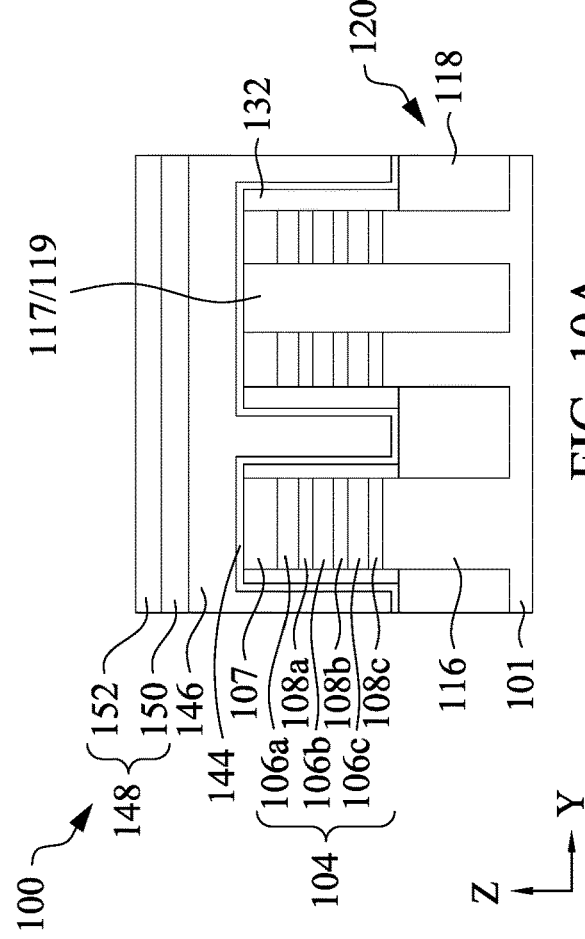
Figure 10C:
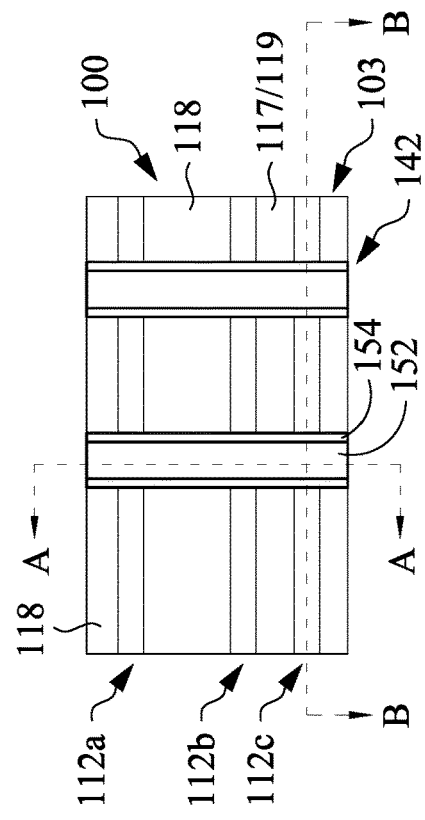

In FIGS. 10A-10C, exposed portions of the fin structures 112, the sacrificial layers 107, and the cladding layers 132, not covered by the sacrificial gate stacks 142 and the spacers 154 are selectively recessed by using one or more suitable etch processes, such as dry etch, wet etch, or a combination thereof. In some embodiments, exposed portions of the stacks of semiconductor layers 104 of the fin structures 112 are removed, exposing portions of the well portions 116, as shown in FIG. 10B. In some embodiments, the exposed portions of the fin structures 112 are recessed to a level at or slightly below the top surface of the insulating material 118.

In FIGS. 11A-11C, edge portions of the sacrificial layers 107 and each second semiconductor layer 108 (e.g., 108a, 108b, 108c) of the stack of semiconductor layers 104 are removed horizontally along the X direction. The removal of the edge portions of the sacrificial layers 107 and the second semiconductor layers 108 forms cavities. In some embodiments, the portions of the sacrificial layers 107 and the second semiconductor layers 108 are removed by a selective wet etching process. In cases where the sacrificial layers 107 and the second semiconductor layers 108 are made of SiGe and the first semiconductor layers 106 are made of silicon, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

After removing edge portions of each second semiconductor layers 108, a dielectric layer is deposited in the cavities to form dielectric spacers 151. The dielectric spacers 151 may be made of a low-K dielectric material, such as SiON, SiCN, SiOC, SiOCN, or SiN. The dielectric spacers 151 may be formed by first forming a conformal dielectric layer using a conformal deposition process, such as ALD, followed by an anisotropic etching to remove portions of the conformal dielectric layer other than the dielectric spacers 151. The dielectric spacers 151 are protected by the first semiconductor layers 106 during the anisotropic etching process. The remaining sacrificial layers 107 and second semiconductor layers 108 (e.g., 108a, 108b, 108c) are capped between the dielectric spacers 151 along the X direction.

Figure 12B:
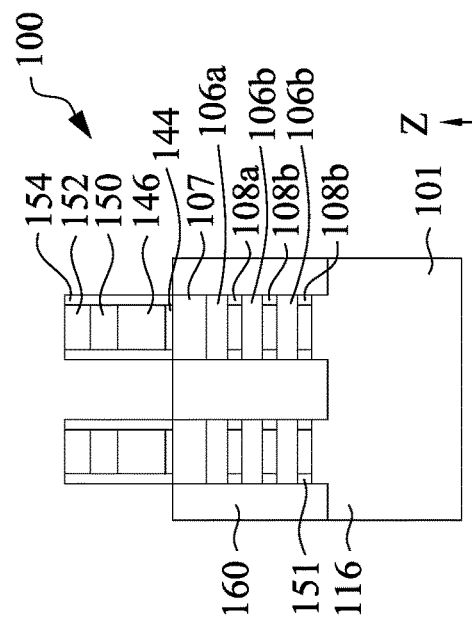
Figure 12A:
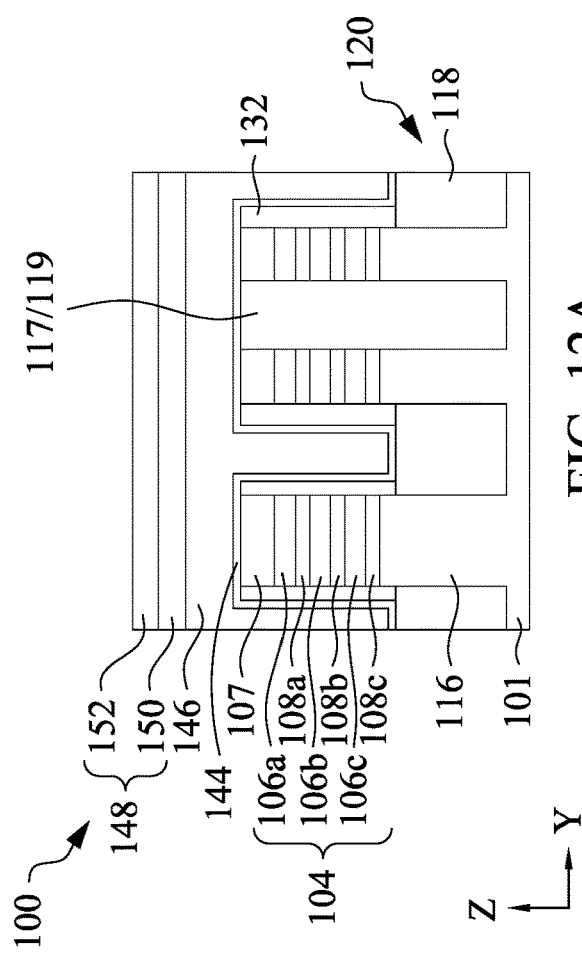
Figure 12C:
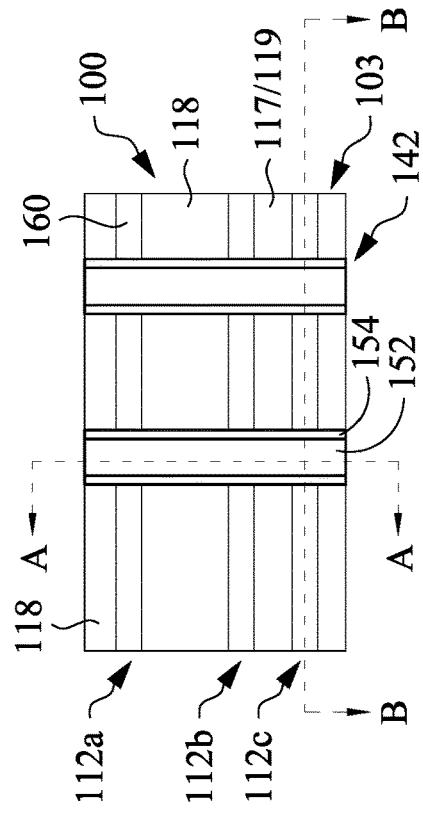

In FIGS. 12A-12C, epitaxial S/D features 160 are formed on the well portions 116 of the fin structures 112a, 112b, 112c. The epitaxial S/D features 160 may be the S/D regions. For example, one of a pair of epitaxial S/D features 160 located on one side of the stack of semiconductor layers 104 can be a source region, and the other of the pair of epitaxial S/D features 160 located on the other side of the stack of semiconductor layers 104 can be a drain region. A pair of epitaxial S/D features 160 includes a source epitaxial feature 160 and a drain epitaxial feature 160 connected by the nanosheet channels (i.e., the first semiconductor layers 106). Source/drain region(s) may refer to a source or a drain, individually or collectively dependent upon the context. In this disclosure, a source and a drain are interchangeably used, and the structures thereof are substantially the same.

For n-channel FETs, the epitaxial S/D features 160 may include one or more layers of Si, SiP, SiC, SiCP, or a group III-V material (InP, GaAs, AlAs, InAs, InAlAs, InGaAs). In some embodiments, the epitaxial S/D features 160 may be doped with n-type dopants, such as phosphorus (P), arsenic (As), etc, for n-type devices. For p-channel FETs, the epitaxial S/D features 160 may include one or more layers of Si, SiGe, SiGeB, Ge, or a group III-V material (InSb, GaSb, InGaSb). In some embodiments, the epitaxial S/D features 160 may be doped with p-type dopants, such as boron (B). The epitaxial S/D features 160 may grow both vertically and horizontally to form facets, which may correspond to crystalline planes of the material used for the substrate 101. The epitaxial S/D features 160 may be formed by an epitaxial growth method using CVD, ALD or MBE.

In FIGS. 13A-13C, a contact etch stop layer (CESL) 162 is formed on exposed surfaces of the epitaxial S/D features 160, the gate spacers 154, and the nitrogen-containing layer 152 of the mask structure 148. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof. The CESL 162 may be formed by CVD, PECVD, ALD, or any suitable deposition technique. In some embodiments, the CESL 162 is a conformal layer formed by the ALD process. Next, an interlayer dielectric (ILD) layer 164 is formed on the CESL 162. The materials for the ILD layer 164 may include an oxide formed from tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 164 may be deposited by a PECVD process or other suitable deposition technique. In some embodiments, after formation of the ILD layer 164, the semiconductor device structure 100 may be subject to a thermal process to anneal the ILD layer 164.

In FIGS. 14A-14C, a planarization process, such as a CMP process, is performed until the tops of the sacrificial gate electrode layer 146 and the spacers 154 are exposed. The planarization process removes portions of the ILD layer 164 and the CESL 162 disposed on the sacrificial gate stacks 142. In some embodiments, the ILD layer 164 may be recessed to a level at the top of the sacrificial gate electrode layer 146. In such cases, a nitrogen-containing layer (not shown), such as a SiCN layer, may be formed on the recessed ILD layer 164 to protect the ILD layer 164 during subsequent etch processes.

Figure 15:
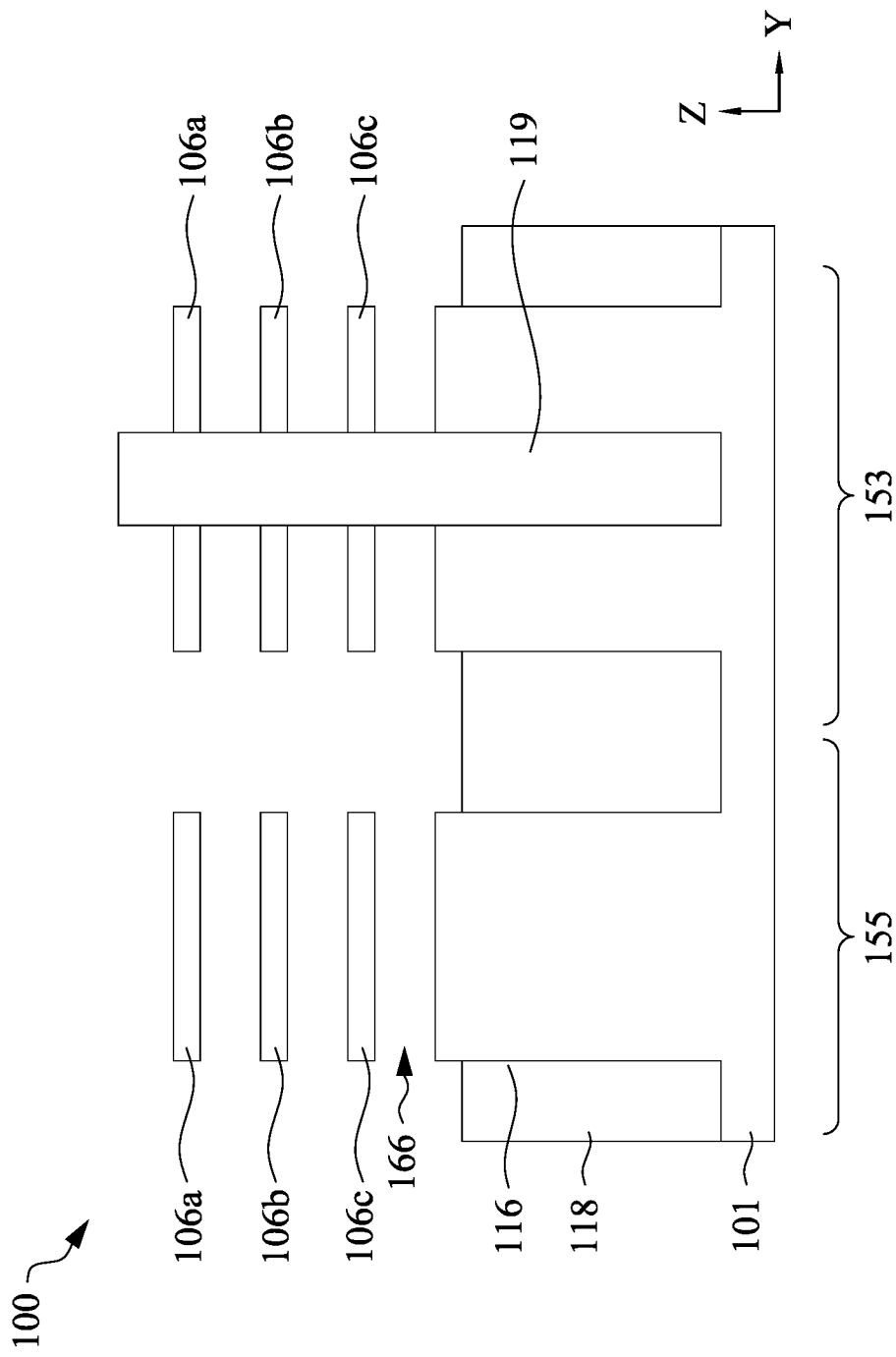
FIGS. 15-18 are cross-sectional views of various stages of manufacturing the semiconductor device structure of FIG. 14A in accordance with some embodiments.

FIGS. 15-18 are cross-sectional views of various stages of manufacturing the semiconductor device structure 100 of FIG. 14A, in accordance with some embodiments. In FIG. 15, the sacrificial gate electrode layer 146 and the sacrificial gate dielectric layer 144 (FIGS. 14A-14C) are removed, exposing portions of the sacrificial layers 107, the cladding layers 132, and the stacks of semiconductor layers 104 (e.g., topmost first semiconductor layer 106a). The sacrificial gate electrode layer 146 may be first removed by any suitable etch process, such as dry etch, wet etch, or a combination thereof, followed by the removal of the sacrificial gate dielectric layer 144, which may be performed by any suitable process, such as dry etch, wet etch, or a combination thereof. The etch process may be one or more selective etch processes that remove the sacrificial gate electrode layer 146 and the sacrificial gate dielectric layer 144 but not the spacers 154, the CESL 162, and the ILD layer 164.

Next, the sacrificial layers 107, the cladding layers 132 and the second semiconductor layers 108 are removed. The removal process exposes portions of the dielectric wall 119, the first semiconductor layers 106 (106a-c), and a portion of the insulating material 118. The removal process may be any suitable processes, such as dry etch, wet etch, or a combination thereof. The removal process may be a selective etch process that removes the sacrificial layers 107, the cladding layers 132, and the second semiconductor layers 108 but not the first semiconductor layers 106, the spacers 154, the dielectric walls 119, and the CESL 162. In cases where the sacrificial layers 107, the cladding layers 132 and the second semiconductor layers 108 are made of SiGe, and the first semiconductor layers 106 are made of silicon, a selective wet etching including an ammonia and hydrogen peroxide mixtures (APM) may be used. As a result of the etch process, openings 166 are formed, leaving the first semiconductor layers 106a-c (from fins 112b and 112c) protruded from opposing sides of the dielectric wall 119. The portions of the first semiconductor layers 106 not covered by the dielectric spacers 151 (not shown) are exposed in the openings 166. Specifically, each of the first semiconductor layers 106a, 106b, 106c has a first end in contact with the dielectric wall 119 and a second end (i.e., distal end) extending away from the first end. The first semiconductor layers 106a-c (from fin 112a) are disposed adjacent the first semiconductor layers 106a-c (from fins 112b and 112c), as shown in FIG. 15. Having the first end of the first semiconductor layers 106a, 106b, 106c directly connected to a portion of the dielectric wall 119 saves the space for subsequent metal gate and increases the overall pattern density. The first semiconductor layers 106a-c from the fins 112b and 112c serve as channel regions for forksheet transistors to be formed at region 153. The first semiconductor layers 106a-c from the fin 112a serve as channel regions for nanosheet transistors to be formed at region 155.

In some embodiments, the first semiconductor layers 106a-c at the region 153 on one side of the dielectric wall 119 may be designated as a P-type FET or N-type FET of the forksheet transistor, and the first semiconductor layers 106a-c at the region 153 on the other side of the dielectric wall 119 may be designated as an N-type FET or P-type FET of the forksheet transistor. In some embodiments, the first semiconductor layers 106a-c at the region 155 adjacent the region 153 may be designated as a P-type FET or N-type FET of the nanosheet transistor. In one exemplary embodiment shown in FIG. 15, the first semiconductor layers 106a-c at the region 153 on the right-hand side of the dielectric wall 119 is designated as a N-type FET of the forksheet transistor, the first semiconductor layers 106a-c at the region 153 on the left-hand side of the dielectric wall 119 is designated as a P-type FET of the forksheet transistor, and the first semiconductor layers 106a-c at the region 155 adjacent the region 153 is designated as a P-type FET of the nanosheet transistor. Alternatively, the first semiconductor layers 106a-c at the region 155 adjacent the region 153 can be designated as N-type FET of the nanosheet transistor. It should be noted that while the region 153 is shown as immediately adjacent to the region 155, the regions 153 and 155 may be separated from each other by other devices, transistors, or features. Various embodiments showing different configurations are to be discussed below with respect to FIGS. 19-24.

Figure 16:
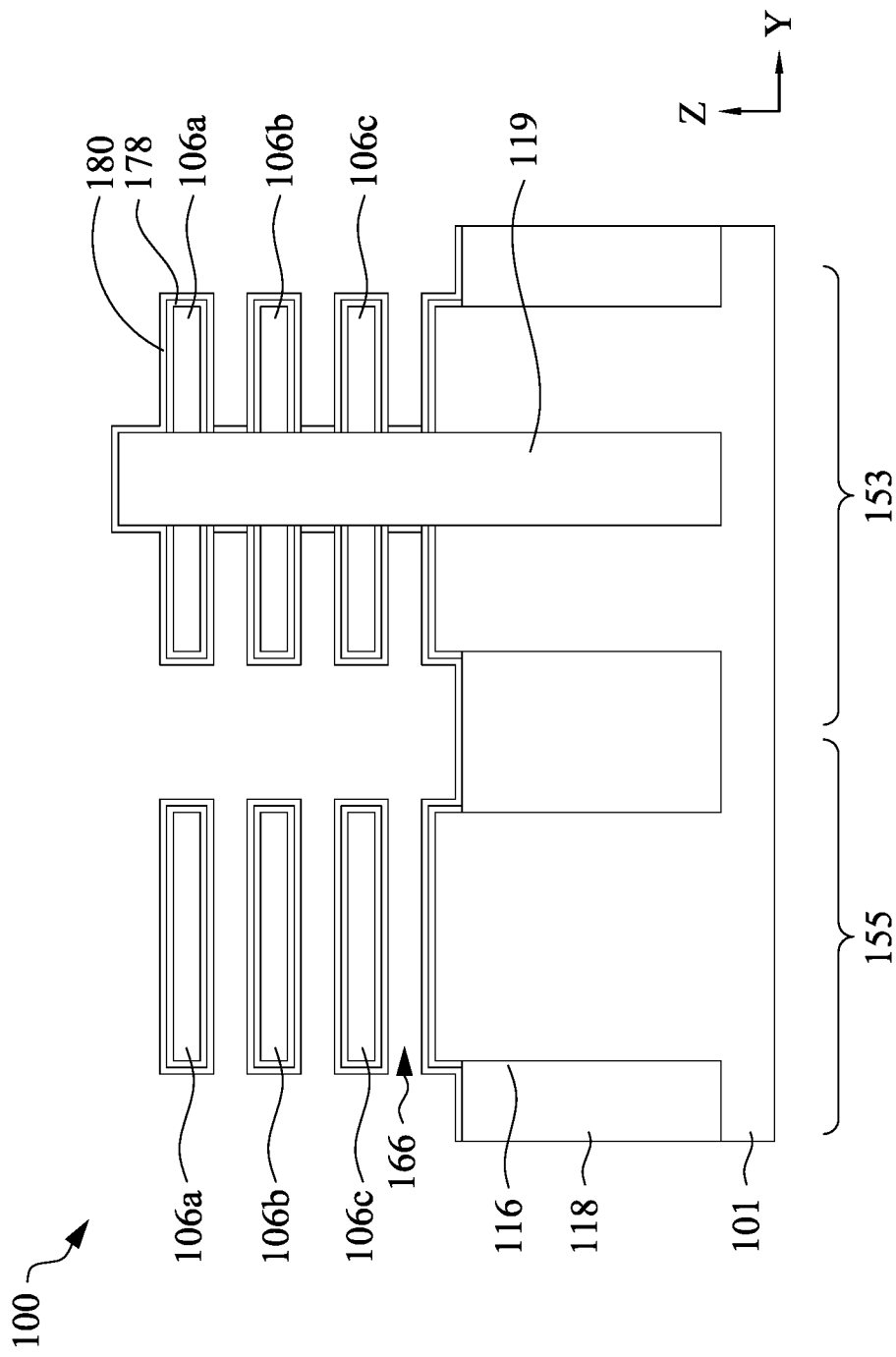

In FIG. 16, an interfacial layer (IL) 178 is formed to surround at least three surfaces of the first semiconductor layers 106 (e.g., first semiconductor layers 106a, 106b, 106c). The IL 178 may also form on the exposed surfaces of the well portion 116 of the substrate 101. In some embodiments, the IL 178 may form on the first semiconductor layers 106 but not on the exposed insulating material 118. The IL 178 may include or be made of an oxygen-containing material or a silicon-containing material, such as silicon oxide, silicon oxynitride, oxynitride, hafnium silicate, etc. The IL 178 may be formed by CVD, ALD or any suitable conformal deposition technique. In one embodiment, the IL 178 is formed using ALD. The thickness of the IL 178 is chosen based on device performance considerations. In some embodiments, the IL 178 has a thickness ranging from about 0.5 nm to about 2 nm.

Next, a high-k (HK) dielectric layer 180 is formed on the exposed surfaces of the semiconductor device structure 100. In some embodiments, the HK dielectric layer 180 is formed on the IL 178, a portion of the insulating material 118, and on the exposed surfaces of the dielectric wall 119, as shown in FIG. 16. The HK dielectric layer 180 may include or be made of the same material as the first and second high-k dielectric layers 140, 143. The HK dielectric layer 180 may be a conformal layer formed by a conformal process, such as an ALD process or a CVD process. The HK dielectric layer 180 may have a thickness of about 0.5 nm to about 3 nm, which may vary depending on the application.

Figure 17:
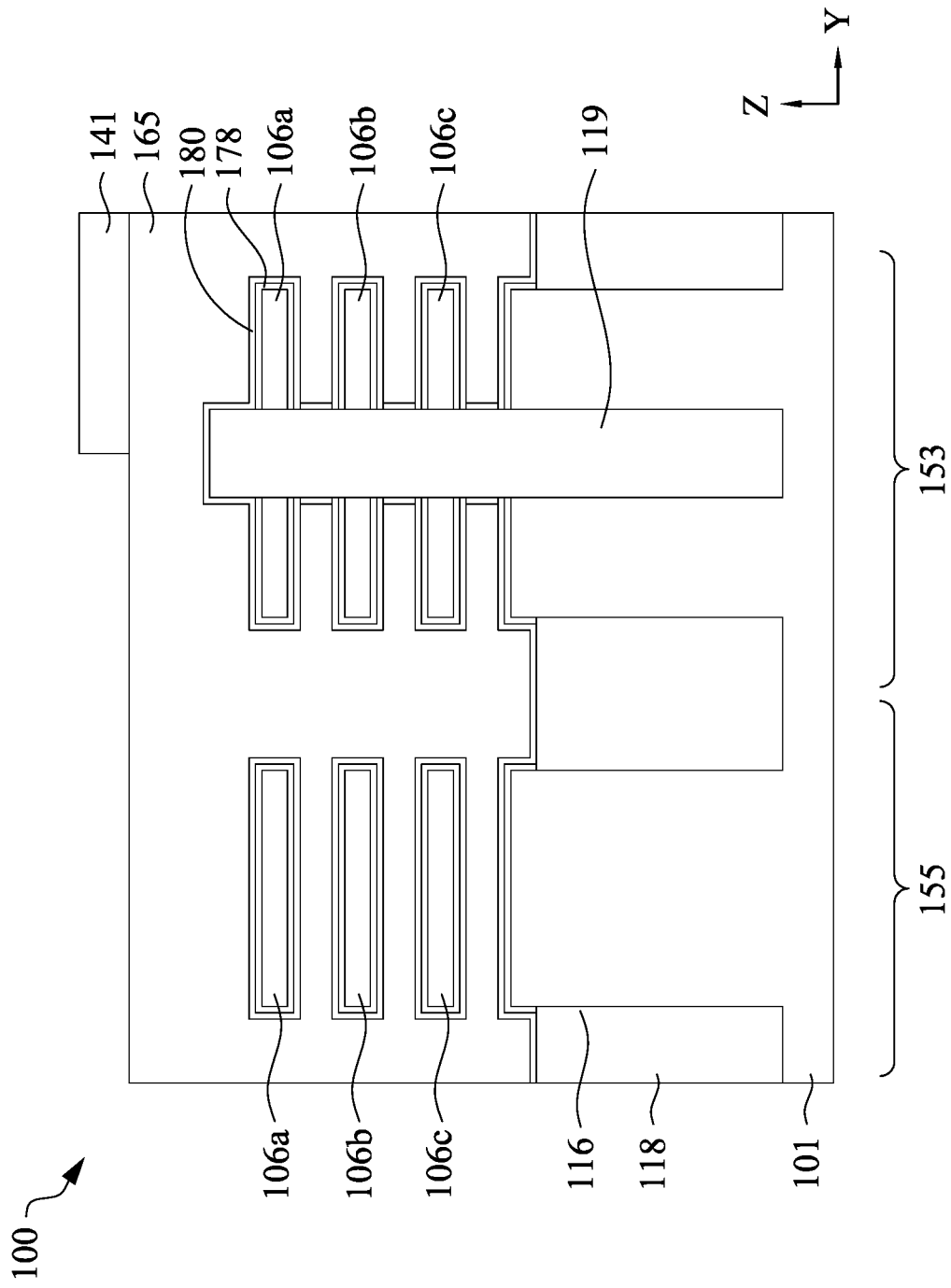

In FIG. 17, after formation of the IL 178 and the HK dielectric layer 180, a first gate electrode layer 165 is formed in the openings 166 (FIG. 16). The first gate electrode layer 165 is formed on the HK dielectric layer 180 to surround a portion of each first semiconductor layer 106a, 106b, 106c and on the insulating material 118. The first gate electrode layer 165 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The first gate electrode layer 165 may be deposited so that at least the forksheet transistors and the nanosheet transistors to be formed at the regions 153, 155 are submerged in the first gate electrode layer 165. The first gate electrode layer 165 may be formed to a predetermined height above the dielectric wall 119, as shown in FIG. 17. In some embodiments, the first gate electrode layer 165 is deposited to a height over a top surface of the HK dielectric layer 180 over the dielectric wall 119. In some embodiments, the first gate electrode layer 165 may be formed using multiple layers, each layer deposited sequentially adjacent to each other using a highly conformal deposition process such as ALD. Other deposition technique such as PVD, CVD, or electro-plating may also be used. While not shown, the first gate electrode layer 165 may include a capping layer, a barrier layer, an n-metal work function layer, a p-metal work function layer, and a fill material. The capping layer and the barrier layer may be metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be formed of a material different from the capping layer. The n-metal work function layer may be formed from a metallic material such as W, Cu, AlCu, TiAlC, TiAlN, Ti, TiN, Ta, TaN, Co, Ni, Ag, Al, TaAl, TaAlC, TaC, TaCN, TaSiN, Mn, Zr, other suitable n-type work function materials, or combinations thereof. The p-metal work function layer may be formed from a metallic material such as W, Al, Cu, TiN, Ti, TiAlN, Ta, TaN, Co, Ni, TaC, TaCN, TaSiN, TaSiN, NiSi$_2$, Mn, Zr, ZrSi$_2$, TaN, Ru, AlCu, Mo, MoSi$_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like.

Next, a patterned resist layer 141 is formed on the exposed surfaces of the semiconductor device structure 100. The patterned resist layer 141 may be first formed to cover N-type FETs, such as N-type FETs of the forksheet transistors at the region 153, while the P-type FETs, such as P-type FETs of the forksheet transistors at the region 153 and the P-type FETs of the nanosheet transistors at the region 155, are left uncovered. The patterned resist layer 141 may be formed by first forming a blanket layer on the semiconductor device structure 100, followed by patterning and etching processes to remove portions of the blanket layer at selected regions to form the patterned resist layer 141. The patterned resist layer 141 may be any suitable masking material, such as a photoresist layer, a BARC (bottom anti-reflective coating) layer, a SOG (spin-on-glass) layer, or a SOC (spin-on-carbon) layer, and may be deposited by spin coating or any suitable deposition technique.

Figure 18:
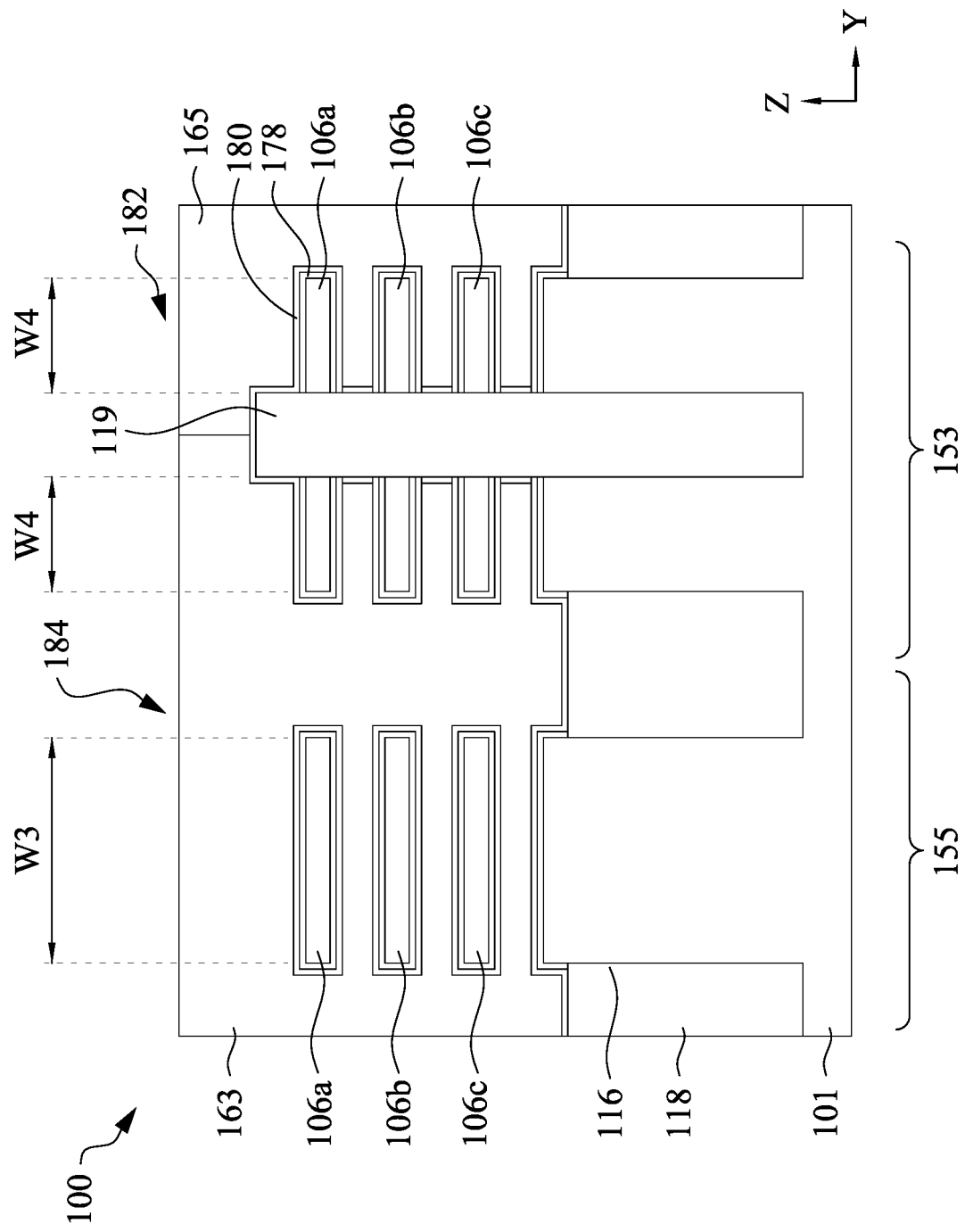
Figures 1, 18:
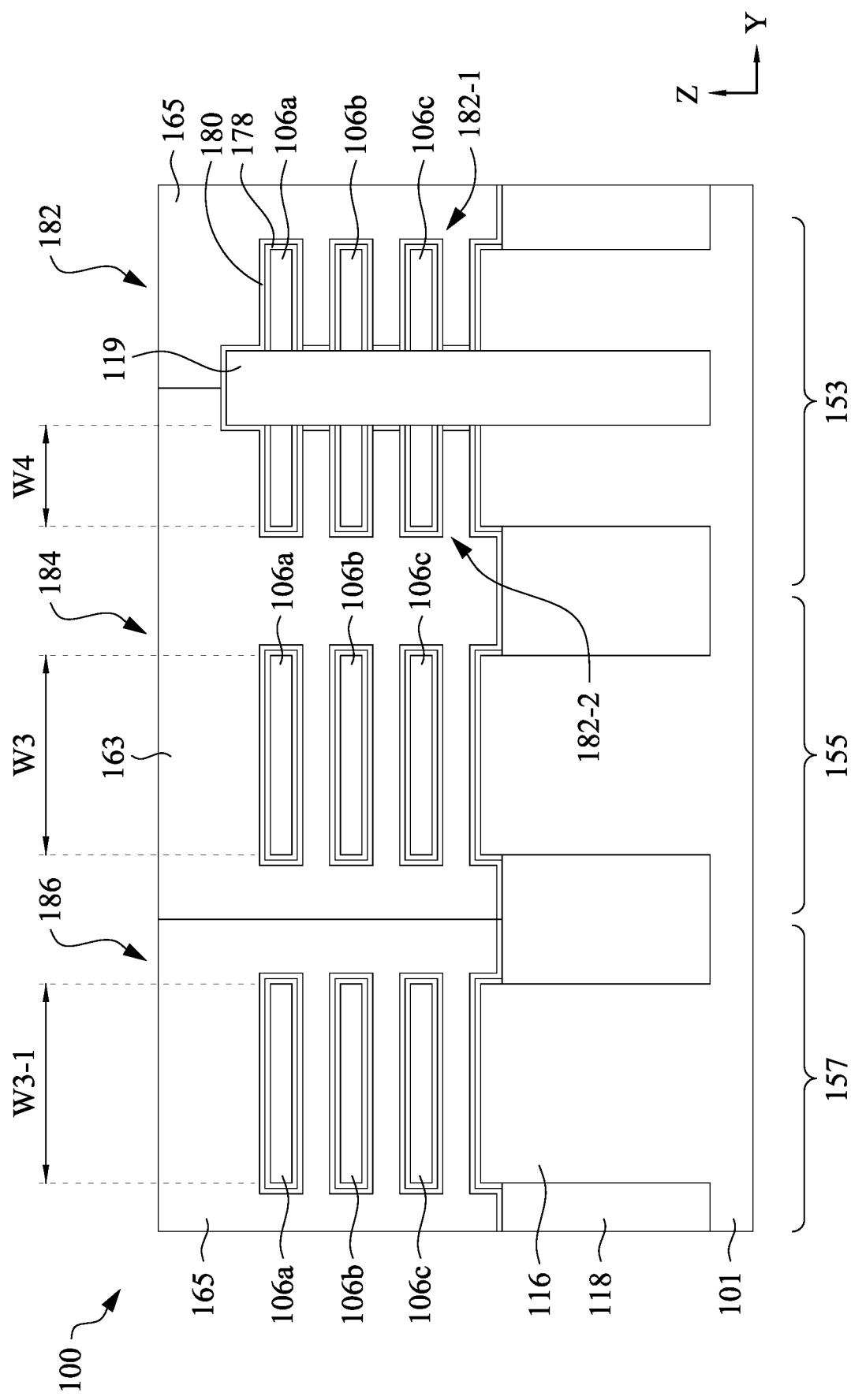

In FIG. 18, portions of the first gate electrode layer 165 at the region 153 not covered by the patterned resist layer 141 are removed and a second gate electrode layer 163 is formed in the region where the first gate electrode layer 165 was removed. The patterned resist layer 141 protects portions of first gate electrode layer 165 on one side of the dielectric wall 119 at the region 153 so that the first gate electrode layer 165 on the other side of the dielectric wall 119 and the first gate electrode layer 165 at the region 155 are removed. The first gate electrode layer 165 may be removed using any suitable processes, such as dry etch, wet etch, or a combination thereof. The removal process may be a selective etch process that removes the first gate electrode layer 165 but not the HK dielectric layer 180.

Next, the second gate electrode layer 163 is formed on the exposed HK dielectric layer 180 and in the region where the first gate electrode layer 165 was removed. The second gate electrode layer 163 may be deposited so that at least the nanosheet transistors at the regions 155 are submerged in the second gate electrode layer 163. The second gate electrode layer 163 surrounds a portion of each first semiconductor layer 106 at the region 155. In some embodiments, the second gate electrode layer 163 is deposited so that the top surface of the second gate electrode layer 163 is substantially co-planar with the first gate electrode layer 165. The second gate electrode layer 163 may include the same material as the first gate electrode layer 165. In some embodiments, the second gate electrode layer 163 is chemically different than the first gate electrode layer 165. Likewise, the second gate electrode layer 163 may be formed using multiple layers, each layer deposited sequentially adjacent to each other using a highly conformal deposition process such as ALD. The second gate electrode layer 163 may also include a capping layer, a barrier layer, an n-metal work function layer, a p-metal work function layer, such as those used for the first gate electrode layer 165. Each layer in the first and second gate electrode layers 165, 163 may be chosen depending on the threshold voltage and application of the NMOS or PMOS devices needed for regions 153, 155.

After the formation of the second gate electrode layer 163, the resist layer 141 is removed using any suitable removal process, such as ashing, dry etch, wet etch, or a combination thereof. A planarization operation, such as a CMP method and/or an etch-back method, may be performed so that the top surfaces of the first and second gate electrode layers 165, 163 are substantially co-planar. As a result of the formation of the first and second gate electrode layers 165, 163, a forksheet transistor 182 and a nanosheet transistor 184 are formed at the region 153 and the region 155, respectively. In one exemplary embodiment, the forksheet transistor 182 includes a NMOS device 182-1 extending outwardly from one side of the dielectric wall 119, and a PMOS device 182-2 extending outwardly form another side of the dielectric wall 119. The nanosheet transistor 184 includes a PMOS device. In some embodiments, the first semiconductor layers 160*a-c* of the nanosheet transistor 184 have a channel width W3 substantially corresponding to the width W1 (FIG. 2) of the fin structure 112*a*, and the first semiconductor layers 106*a-c* of the forksheet transistor 182 extending from one side (or both sides) of the dielectric wall 119 has a channel width W4 corresponding to the width W2 (FIG. 2). In various embodiments, the channel width W3 is greater than the channel width W4. For example, the channel width W3 may be about 1.5 to about 10 times greater than the channel width W4. In some embodiments, the channel width W3 may be in a range of about 5 nm to about 120 nm. The nanosheet transistor 184 provides higher speed and current than the forksheet transistor 182 due to greater channel width W3. The nanosheet transistors 184 therefore are more suitable for high-speed applications, such as a NAND device or high-performance computing (HPC). The devices with a narrower channel, such as the device fabricated from the fin structures 112*b*, 112*c*, may be more suitable for low-power and low-leakage applications, such as an inverter device or system-on-chip (SOC).

FIG. 18-1 illustrates a cross-sectional view of the semiconductor device structure 100 in accordance with some embodiments. The embodiment in FIG. 18-1 is substantially identical to the embodiment of FIG. 18 except that a nanosheet transistor 186 is further formed at the region 157 adjacent to the region 155 on which the nanosheet transistor 184 is formed. The nanosheet transistor 186 may be a transistor having a conductivity opposite to the nanosheet transistor 184. In one exemplary embodiment, the forksheet transistor 182 includes a NMOS device 182-1 extending outwardly from one side of the dielectric wall 119, and a PMOS device 182-2 extending outwardly form another side of the dielectric wall 119. The nanosheet transistor 184 includes a PMOS device. In another exemplary embodiment, the forksheet transistor 182 includes a PMOS device extending outwardly from one side of the dielectric wall 119, and a NMOS device extending outwardly form another side of the dielectric wall 119. The nanosheet transistor 186 includes a NMOS device. In various embodiments, the nanosheet transistor 186 has a channel width W3-1 that is greater than the channel width W4. For example, the channel width W3-1 may be about 1.5 to about 10 times greater than the channel width W4. In some embodiments, the channel width W3-1 may be equal to the channel width W3 of the nanosheet transistor 184. The nanosheet transistors 184 and 186 provide higher speed and current than the forksheet transistor 182 due to greater channel widths W3 and W3-1.

It is understood that the semiconductor device structures 100, 200 may undergo further complementary metal oxide semiconductor (CMOS) and/or back-end-of-line (BEOL) processes to form various features such as transistors, contacts/vias, interconnect metal layers, dielectric layers, passivation layers, etc. The semiconductor device structure 100 may also include backside contacts (not shown) on the backside of the substrate 101 by flipping over the semiconductor device structure 100, removing the substrate 101, and selectively connecting source or drain feature/terminal of the epitaxial S/D features 160 to a backside power rail (e.g., positive voltage VDD or negative voltage VSS) through the backside contacts. Depending on the application, the source or drain feature/terminal of the epitaxial S/D features 160 and the gate electrode layers 163, 165 may be connected to a frontside power source.

Various embodiments of the present disclosure provide a methodology that can be used to improve performance, power efficiency, transistor density, and cost of semiconductor device structures involving logic, SRAM, analog, and I/O, etc. Particularly, embodiments of the present disclosure propose a single chip having different circuits with varied channel widths for high-speed/high power consumption applications and low-power consumption applications/high-density device requirements, respectively. As discussed above, a single chip may have a first region (e.g., region 155) in which a first circuit (e.g., nanosheet transistors) is formed and configured for handling high-speed/high power consumption applications, and a second circuit (e.g., forksheet transistor) is formed and configured for handling low-power consumption/low-leakage applications with high-density device requirement. FIGS. 19-24 illustrate possible arrangements of the nanosheet transistors and the forksheet transistors, in accordance with some embodiments.

Figure 19:
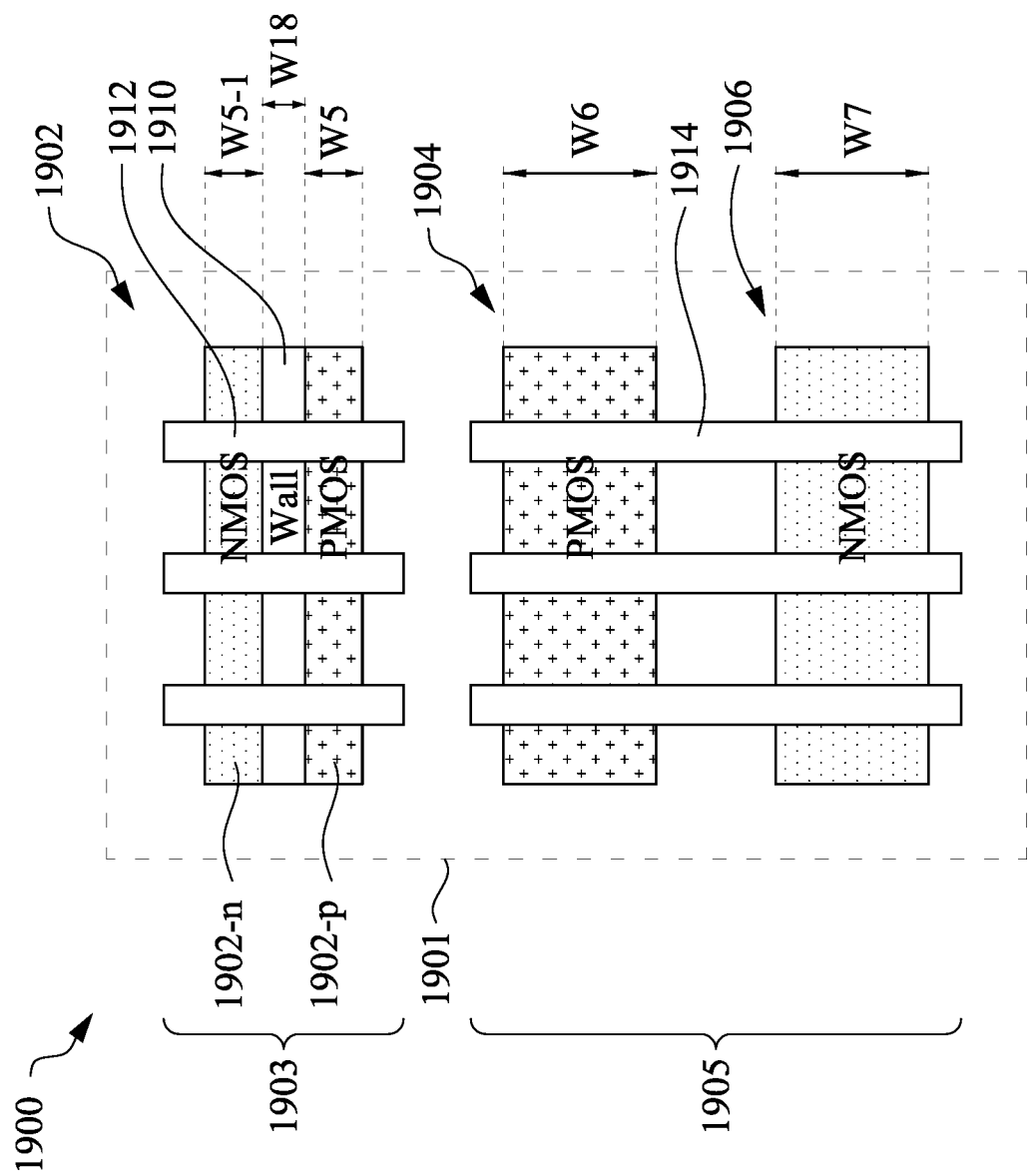
FIGS. 19-26 are top-views of a semiconductor device structure, in accordance with some embodiments.

FIG. 19 illustrates a top-view a semiconductor device structure 1900, in accordance with some embodiments. The semiconductor device structure 1900 includes a first circuit 1902, a second circuit 1904, and a third circuit 1906 disposed on a chip or substrate 1901. The first circuit 1902 is disposed at a first region 1903 of the substrate 1901, the second and third circuits 1904, 1906 are disposed at a second region 1905 of the substrate 1901 adjacent the first region 1903. The first circuit 1902 may be a forksheet transistor, such as the forksheet transistor 182 discussed above with respect to FIG. 18, and the second and third circuits 1904, 1906 may be nanosheet transistors, such as the nanosheet transistors 184, 186 discussed above with respect to FIGS. 18 and 18-1. Like the forksheet transistor 182, the first circuit 1902 may include a dielectric wall 1910, such as the dielectric wall 119, with a NMOS device 1902-*n* and a PMOS device 1902-*p* extending outwardly from the dielectric wall 1910.

The first circuit 1902 has three gate structures 1912 disposed across the NMOS device 1902-*n*, PMOS device 1902-*p*, and the dielectric wall 119 along a direction perpendicular to the direction of the dielectric wall 1910. The second circuit 1904 may be a PMOS device and the third circuit 1906 may be a NMOS device. Three gate structures 1914 are disposed to across the PMOS device and the NMOS device. The second and third circuits 1904, 1906 are electrically connected through the gate structures 1914. The NMOS device 1902-n and PMOS device 1902-p of the first circuit 1902 are electrically connected through the gate structures 1912. In some embodiments, the gate structures 1912 and the gate structures 1914 have the same gate pitch and the same gate length. The NMOS device 1902-n or PMOS device 1902-p of the first circuit 1902 has a channel width W5, the PMOS device of the second circuit 1904 has a channel width W6, and the NMOS device of the third circuit 1906 has a channel width W7. In various embodiments, the channel width W5 is greater than the channel widths W6 and W7. In some embodiments, the channel width W5 is about 1.5 to about 10 times wider than the channel widths W6 and W7. The first circuit 1902 may be used for low-power and low-leakage applications such as core devices of a SOC, and the second and third circuits 1904, 1906 may be used for high-speed/high power consumption applications such as I/O devices, HPC devices, and/or SOC.

In some embodiments, which can be combined with any other embodiments of the present disclosure (e.g., embodiments shown in FIGS. 18 and 18-1), the second and third circuits 1904, 1906 may have a larger gate contact width than the gate contact width of the first circuit 1902. For example, the second and third circuits 1904, 1906 may have a gate contact width that is about 10% to about 40% (or about 1.1 to about 1.4 times) larger than the gate contact width of the first circuit 1902.

In some embodiments, which can be combined with any other embodiments of the present disclosure (e.g., embodiments shown in FIGS. 18 and 18-1), the second and third circuits 1904, 1906 may have a larger gate via contact than the gate via contact of the first circuit 1902. For example, the second and third circuits 1904, 1906 may have a gate via contact that is about 50% to about 400% (or about 1.5 to about 5 times) larger than the gate via contact of the first circuit 1902. Similarly, the second and third circuits 1904, 1906 may have a larger gate contact width than the gate contact width of the first circuit 1902. For example, the second and third circuits 1904, 1906 may have a gate contact width that is about 30% to about 400% (or about 1.3 to about 5 times) larger than the gate contact width of the first circuit 1902.

In some embodiments, which can be combined with any other embodiments of the present disclosure (e.g., embodiments shown in FIGS. 18 and 18-1), the NMOS device 1902-n and the PMOS device 1902-p of the first circuit 1902 may have different channel widths. For example, the NMOS device 1902-n may have a channel width W5-1 and the PMOS device 1902-p may have a channel width W5 that is about 0.4 to about 2.5 times greater than the channel width W5-1, or vice versa. Likewise, the PMOS device of the second circuit 1904 may have a channel width different than the channel width of the NMOS device of the third circuit 1906. For example, the PMOS device of the second circuit 1904 may have a channel width W6 that is about 0.4 to about 2.5 times greater than the channel width W7, or vice versa.

In some embodiments, which can be combined with any other embodiments of the present disclosure (e.g., embodiments shown in FIGS. 18 and 18-1), the dielectric wall 1910 may have a width W18 that is different than the channel width W5 or W5-1. For example, the channel width W5 of the first circuit 1902 may be about 0.2 to about 3 times greater than the width W18 of the dielectric wall 1910.

In some embodiments, which can be combined with any other embodiments of the present disclosure (e.g., embodiments shown in FIGS. 18 and 18-1), the second and/or third circuits 1904, 1906 may have a greater number of channel stacks (e.g., first semiconductor layers 106) than that of the first circuit 1902, or vice versa. For example, in some embodiments the first circuit 1902 may have about 2 to 4 channels vertically stacked and the second and/or third circuits 1904, 1906 may have about 3 to 7 channels vertically stacked, or vice versa.

In some embodiments, which can be combined with any other embodiments of the present disclosure (e.g., embodiments shown in FIGS. 18 and 18-1), the second and/or third circuits 1904, 1906 may have a sheet space (i.e., the space between two adjacent first semiconductor layers 106) different than the sheet space of the first circuit 1902. For example, the second and/or third circuits 1904, 1906 may have a sheet space that is about 20% to about 100% (or about 1.2 to about 2 times) greater than the sheet space of the first circuit 1902. Alternatively, in some embodiments where the second and third circuits 1904, 1906 are used as I/O devices, the second and/or third circuits 1904, 1906 may have a sheet space that is about 20% to about 100% (or about 1.2 to about 2 times) smaller than the sheet space of the first circuit 1902.

In some embodiments, which can be combined with any other embodiments of the present disclosure (e.g., embodiments shown in FIGS. 18 and 18-1), the second and/or third circuits 1904, 1906 may have a thicker IL (e.g., IL 178) disposed between the channel layer (e.g., first semiconductor layers 106) and the HK dielectric layer (e.g., HK dielectric layer 180) than the IL of the first circuit 1902. For example, the thickness of the IL disposed at the second and/or third circuits 1904, 1906 may be about 50% to about 300% (or about 1.5 to about 4 times) greater than the thickness of the IL disposed at the first circuit 1902. In some embodiments where the second and/or third circuits 1904, 1906 are used as I/O devices, the IL may have a thickness of about 2 nm to about 6 nm. In some embodiments where the second and/or third circuits 1904, 1906 are used as SOC core devices, the IL may have a thickness of about 0.8 nm to about 1 nm.

In some embodiments, which can be combined with any other embodiments of the present disclosure (e.g., embodiments shown in FIGS. 18 and 18-1), the epitaxial S/D features (e.g., epitaxial S/D features 160) at the second and/or third circuits 1904, 1906 may have greater height than that of the epitaxial S/D features at the first circuit 1902. For example, the height of the epitaxial S/D features at the second and/or third circuits 1904, 1906 may be about 5% to about 40% (or about 1.5 to about 1.4 times) greater than the height of the epitaxial S/D features at the first circuit 1902. This may apply to PMOS devices only, NMOS devices only, or both of PMOS and NMOS devices.

Figure 20:
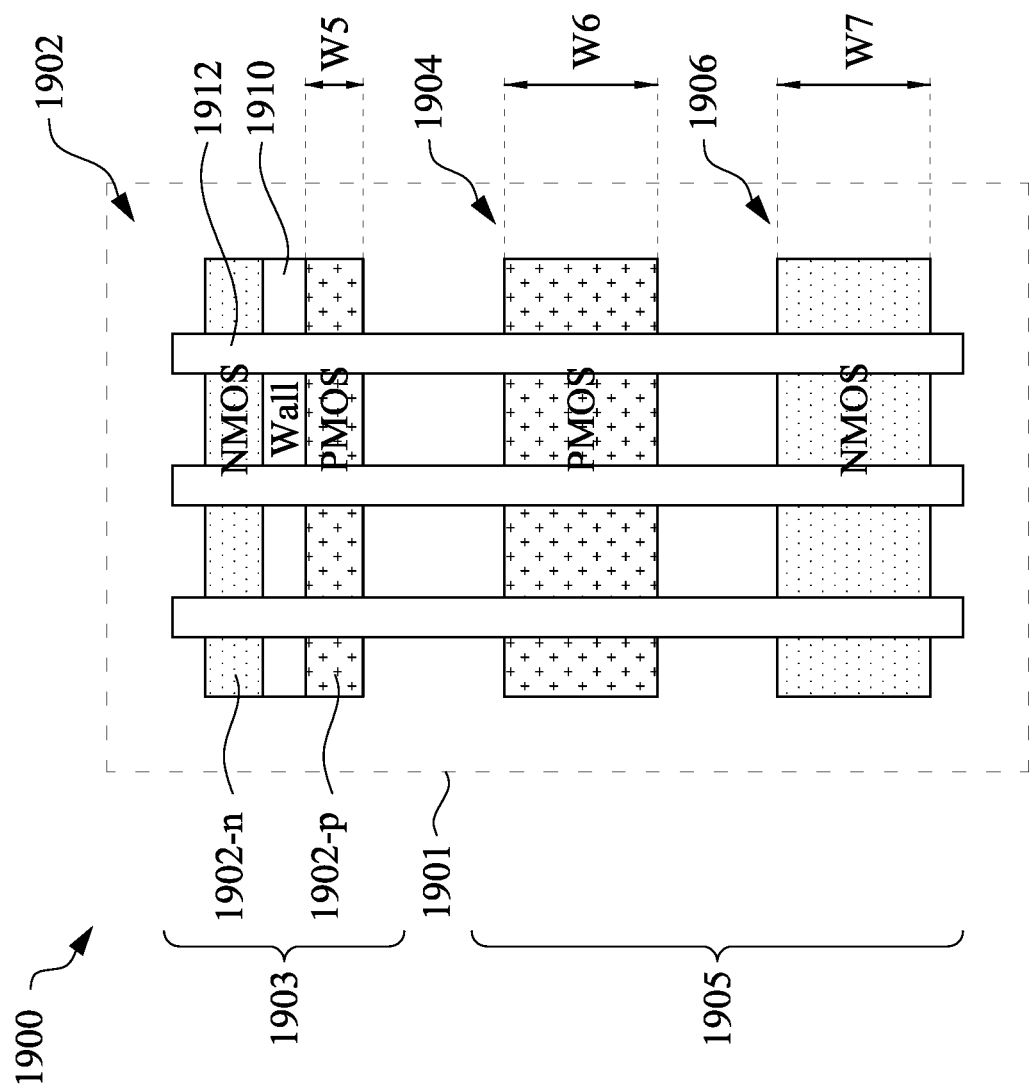

FIG. 20 illustrates a top-view of the semiconductor device structure 1900 of FIG. 19 in accordance another embodiment. The embodiment of FIG. 20 is substantially identical to the embodiment of FIG. 19 except that the gate structures 1912 (or gate structures 1914) extend across the first, second, and third circuits 1902, 1904, 1906 in a way that the NMOS device 1902-n and PMOS device 1902-p of the first and second circuits 1902, 1904, as well as the NMOS device of third circuit 1906 are electrically connected.

Figure 21:
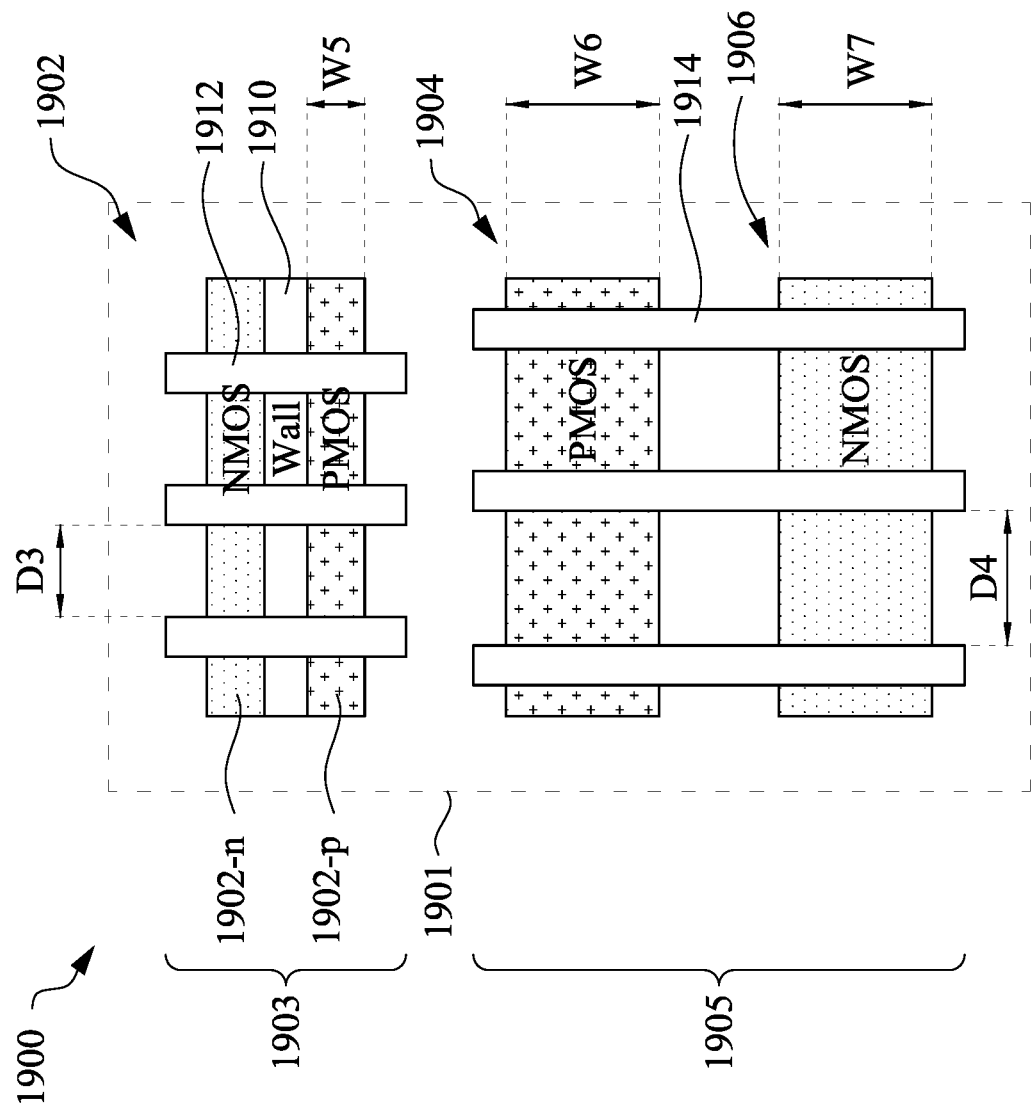

FIG. 21 illustrates a top-view of the semiconductor device structure 1900 of FIG. 19 in accordance one another embodiment. The embodiment of FIG. 21 is substantially identical to the embodiment of FIG. 19 except that the gate structures 1912 extending across the first circuit 1902 have a first gate pitch D3 at the region 1903 and the gate structures 1914 extending across the second and third circuits 1904, 1906 at the region 1905 have a second gate pitch D4 that is greater than the first gate pitch D3. In some embodiments, the second gate pitch D4 is about 5% to about 20% greater than the first gate pitch D3. In cases where the second and third circuits 1904, 1906 are used for HPC core devices and the first circuit 1902 is used for SOC core devices, the second gate pitch D4 may be about 1.05 to about 1.2 times greater than the first gate pitch D3 due to higher speed requirements needed by the HPC devices. In some embodiments, the second gate pitch D4 is about 10% to about 200% greater than the first gate pitch D3. In cases where the second and third circuits 1904, 1906 are used for I/O devices and the first circuit 1902 is used for SOC core devices, the second gate pitch D4 may be about 1.1 to about 3 times greater than the first gate pitch D3 due to higher speed requirements needed by the HPC devices.

Figure 22:
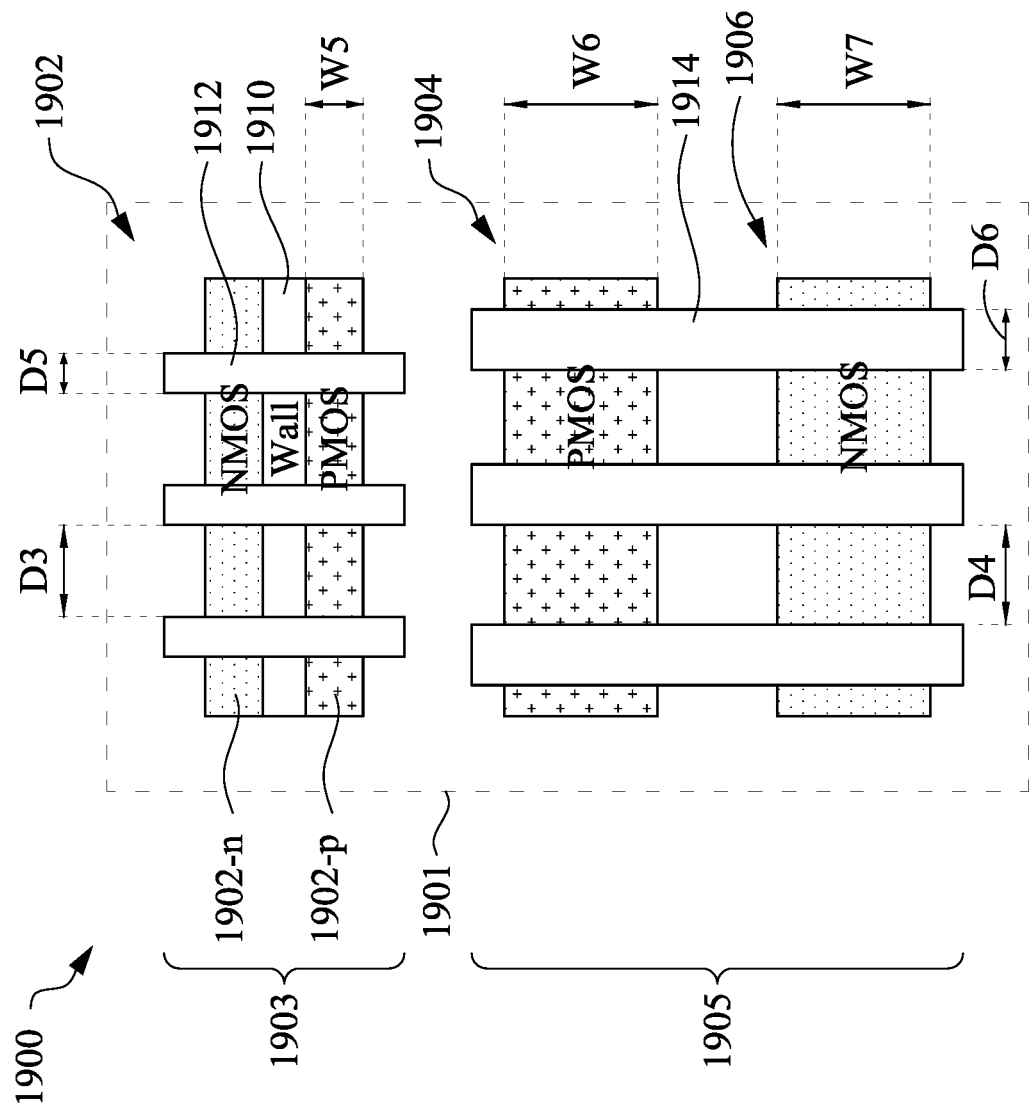

FIG. 22 illustrates a top-view of the semiconductor device structure 1900 of FIG. 19 in accordance yet another embodiment. The embodiment of FIG. 22 is substantially identical to the embodiment of FIG. 21 except that the gate structures 1912 extending across the first circuit 1902 have a first gate length (Lg) D5 at the region 1903 and the gate structures 1914 extending across the second and third circuits 1904, 1906 at the region 1905 have a second gate length D6 that is greater than the first gate length D5. In cases where the second and third circuits 1904, 1906 are used for I/O devices and the first circuit 1902 is used for SOC core devices, the second gate length D6 may be about 3 to about 10 times greater than the first gate length D5 due to higher speed requirements needed by the I/O devices. Due to greater second gate length D6, the size of the gate via contact disposed over the gate structures 1914 is larger than that of the gate via contact disposed over the gate structures 1912. In some embodiments, the size of the gate via contact disposed over the gate structures 1914 is about 10% to about 150% (or about 1.1 to about 2.5 times) larger than the size of the gate via contact disposed over the gate structures 1912.

Figure 23:
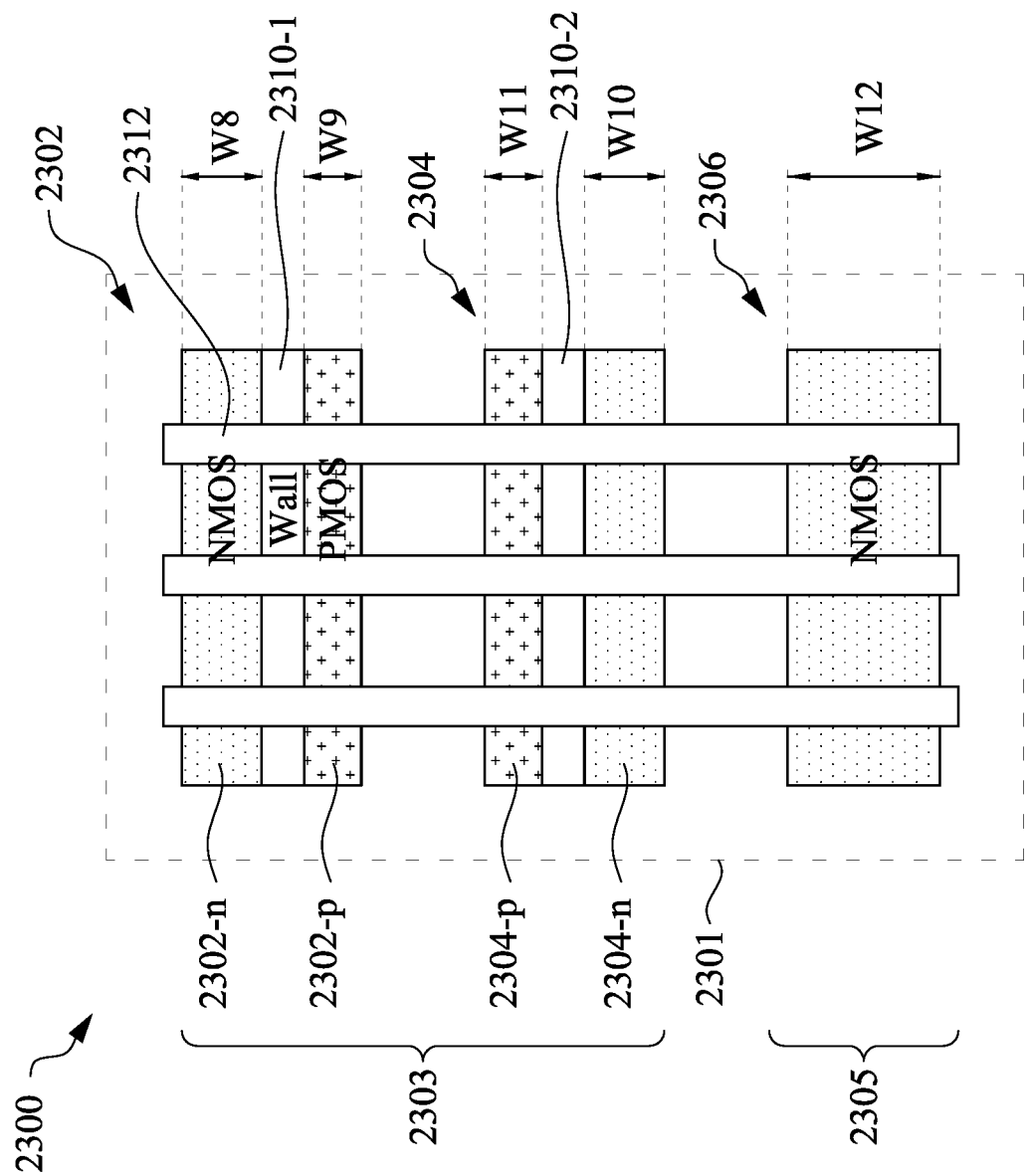

FIG. 23 illustrates a top-view of a semiconductor device structure 2300, in accordance some embodiments. In this embodiment, the semiconductor device structure 2300 includes a first circuit 2302, a second circuit 2304, and a third circuit 2306 disposed on a chip or substrate 2301. In some embodiments, the semiconductor device structure 2300 serves as a multi-port SRAM cell having one or more write ports and/or one or more read ports. For example, the first and second circuits 2302, 2304 may be used as write-port circuits for applications that require higher density, and the third circuit 2306 may be used as read-port circuit for high current applications. In some embodiments, the first circuit 2302 and the second circuit 2304 are disposed at a first region 2303 of the substrate 2301, and the third circuit 2306 are disposed at a second region 2305 of the substrate 2301 adjacent the first region 2303. The first and second circuits 2302, 2304 may be a forksheet transistor, such as the forksheet transistor 182 discussed above with respect to FIG. 18, and the third circuits 2306 may be nanosheet transistors, such as the nanosheet transistors 184, 186 discussed above with respect to FIGS. 18 and 18-1. Like the forksheet transistor 182, the first circuit 2302 may include a dielectric wall 2310-1, such as the dielectric wall 119, with a NMOS device 2302-n and a PMOS device 2302-p extending outwardly from opposing sides of the dielectric wall 2310-1. The second circuit 2304 may also include a dielectric wall 2310-1, such as the dielectric wall 119, with a NMOS device 2304-n and a PMOS device 2304-p extending outwardly from opposing sides of the dielectric wall 2310-2. Particularly, the PMOS device 2302-p of the first circuit 2302 is disposed adjacent the PMOS device 2402-p of the second circuit 2304. The third circuit 2306 may be a NMOS device.

Three gate structures 2312 are disposed to extend in a direction perpendicular to the direction of the dielectric walls 2310-1, 2310-2 across the first, second, and third circuits 2302, 2304, 2306 in a way that the NMOS device 2302-n and PMOS device 2302-p of the first circuit 1902, the NMOS device 2304-n and PMOS device 2304-p of the second circuit 2304, as well as the NMOS device of third circuit 2306 are electrically connected. In some embodiments, the gate structures 2312 have the same gate pitch and the same gate length. In some embodiments, the NMOS device 2302-n of the first circuit 2302 has a channel width W8, and the PMOS device 2302-p of the first circuit 2302 has a channel width W9 less than the channel width W8. For example, the channel width W8 may be about 0.4 to about 2.5 times greater than the channel width W9. Likewise, the NMOS device 2304-n of the second circuit 2304 has a channel width W10, and the PMOS device 2304-p of the first circuit 2304 has a channel width W11 less than the channel width W10. For example, the channel width W10 may be about 0.4 to about 2.5 times greater than the channel width W11. In some embodiments, the channel widths W8 and W10 are substantially equal, and the channel width W9 and W11 are substantially equal. In some embodiments, the channel width W8 is about 1.5 to about 3 times greater than the channel width W9. The NMOS device of the third circuit 2306 has a channel width W12 that is greater than the channel widths W8, W9, W10, and W11. In some embodiments, the channel width W12 is about 1.5 to about 12 times greater than the channel widths W9 or W11. In some embodiments, the channel width W12 is about 1.3 to about 8 times greater than the channel widths W8 or W10.

Figure 24:
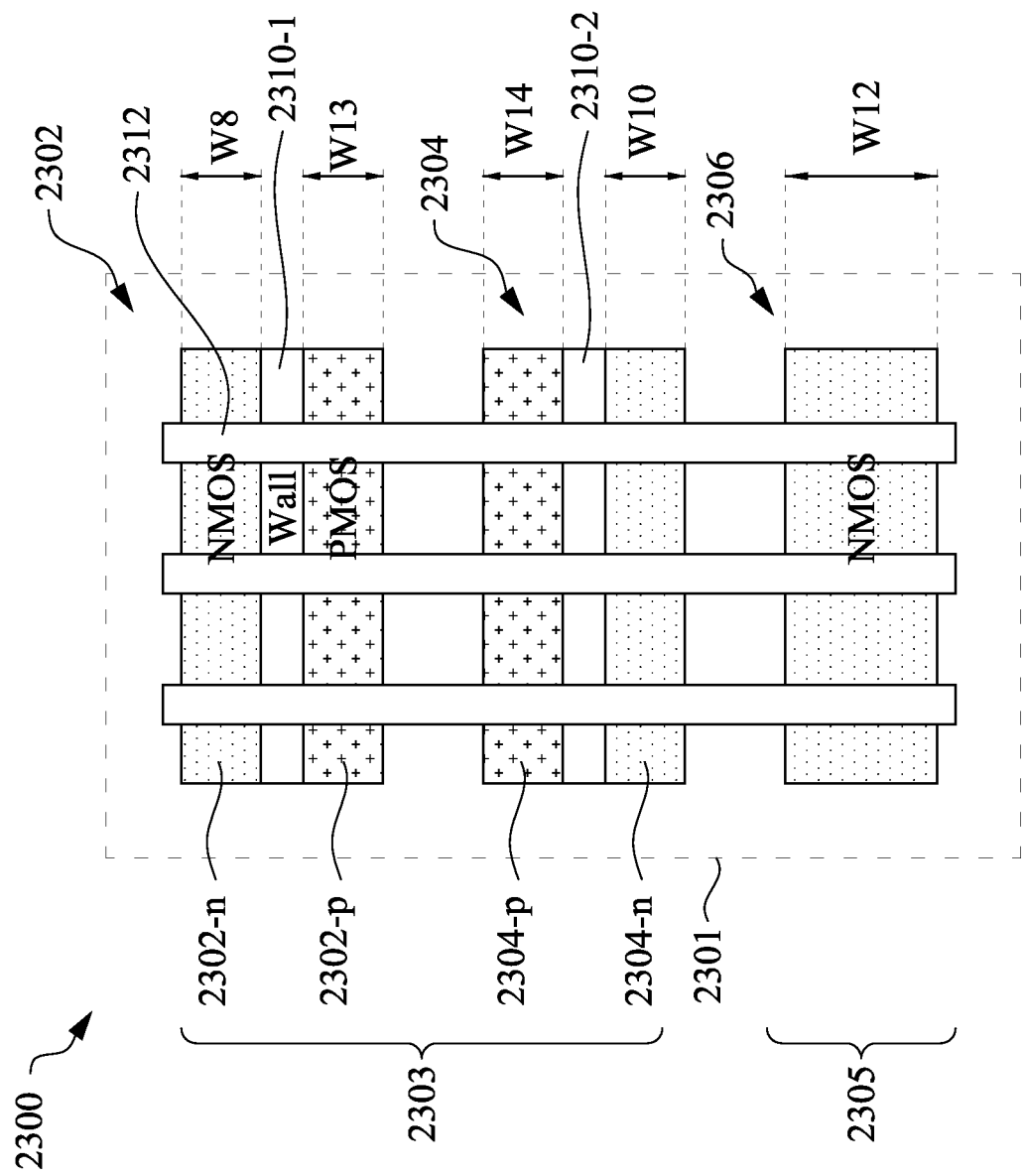

FIG. 24 illustrates a top-view of the semiconductor device structure 2300 of FIG. 23 in accordance another embodiment. The embodiment of FIG. 24 is substantially identical to the embodiment of FIG. 23 except that the PMOS device 2302-p of the first circuit 2302 has a channel width W13 and the PMOS device 2304-p of the second circuit 2304 has a channel width W14 that is substantially equal to the channel width W13. In some embodiments, the channel width W13 and the channel width W8 are substantially equal, and the channel width W14 and the channel width W10 are substantially equal. In some embodiments, the channel width W13 is greater than the channel width W14. In some embodiments, the channel width W14 is greater than the channel width W13.

Figure 25:
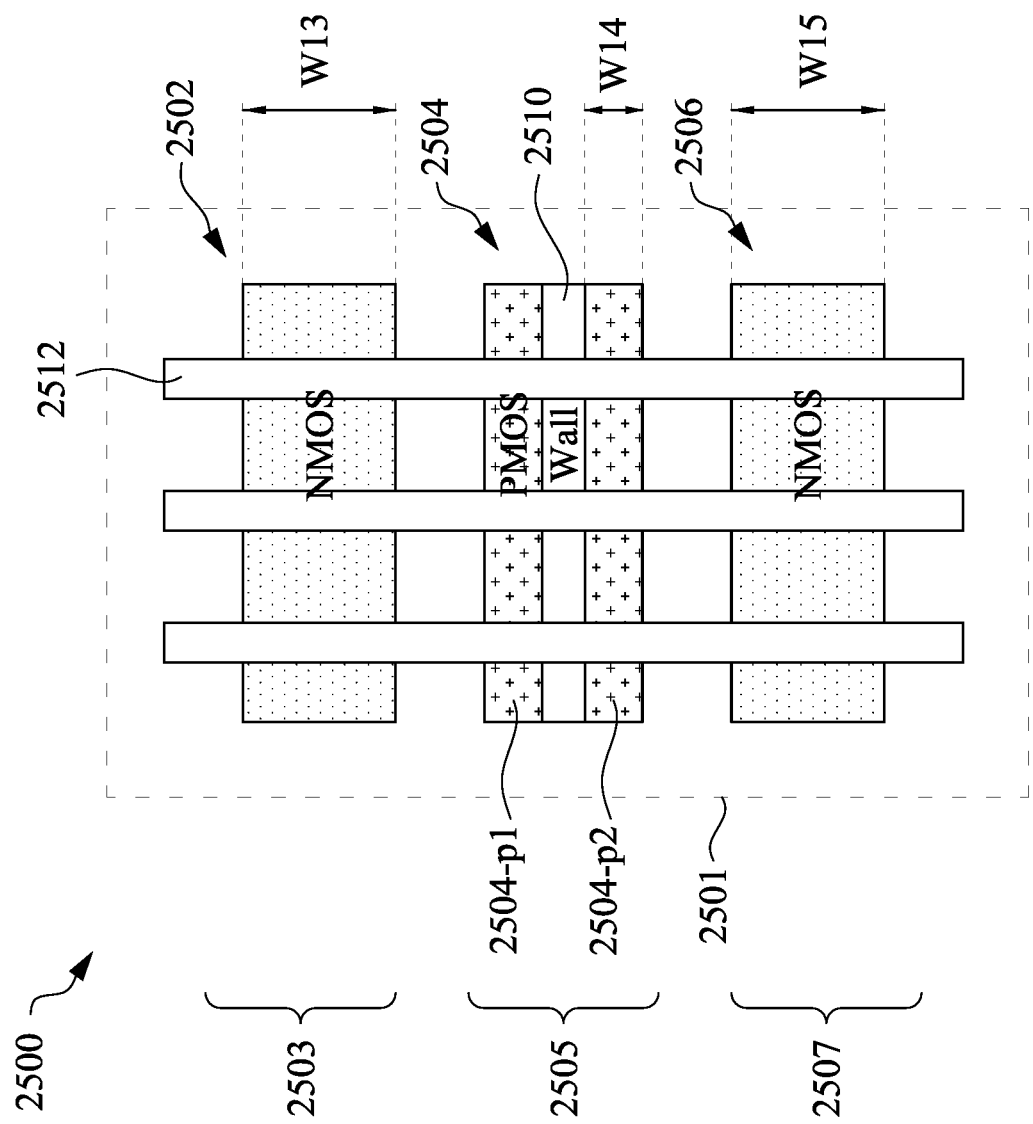

FIG. 25 illustrates a top-view of a semiconductor device structure 2500 of FIG. 23 in accordance another embodiment. In this embodiment, the semiconductor device structure 2500 includes a first circuit 2502, a second circuit 2504, and a third circuit 2506 disposed on a chip or substrate 2501. In some embodiments, the semiconductor device structure 2500 is a single-port SRAM cell having first circuit 2502 and/or third circuit 2506 used as read ports. For example, the first circuit 2502 and/or third circuit 2506 may be used as read-port circuits for high current applications, and the second circuit 2504 may be used as write-port circuit for applications that require higher density. In some embodiments, the first circuit 2502, the second circuit 2504, and the third circuit 2506 are disposed at a first region 2503, a second region 2505, and a third region 2507 of the substrate 2501, respectively. The first region 2503, the second region 2505, and the third region 2507 are adjacent to each other. The second circuit 2504 may be a forksheet transistor, such as the forksheet transistor 182 discussed above with respect to FIG. 18, and the first and third circuits 2502, 2506 may be nanosheet transistors, such as the nanosheet transistors 184, 186 discussed above with respect to FIGS. 18 and 18-1. Like the forksheet transistor 182, the second circuit 2504 may include a dielectric wall 2510, such as the dielectric wall 119, with a PMOS device 2504-p1 and a PMOS device 2504-p2 extending outwardly from opposing sides of the dielectric wall 2510. Particularly, the PMOS device 2504-p1 of the second circuit 2504 is disposed adjacent the first circuit 2502, which is a NMOS device, and the PMOS 2504-p2 of the second circuit 2504 is disposed adjacent the third circuit 2506, which is also a NMOS device.

Three gate structures 2512 are disposed to extend in a direction perpendicular to the direction of the dielectric walls 2510 across the first, second, and third circuits 2502, 2504, 2506 in a way that the NMOS device of the first circuit 2502, the PMOS device 2504-p1 of the second circuit 2504, the PMOS 2504-p2 of the second circuit 2504, and the NMOS device of the third circuit 2506 are electrically connected. In some embodiments, the gate structures 2512 have the same gate pitch and the same gate length. In some embodiments, the NMOS device of the first circuit 2502 has a channel width W13, and the PMOS device 2504-p1 or 2504-p2 of the second circuit 2504 has a channel width W14 that is less than the channel width W13. The NMOS device of the third circuit 2506 has a channel width W15 that is substantially equal to the channel width W13. In some embodiments, the channel width W13 is about 1.5 to about 10 times greater than the channel widths W14.

Figure 26:
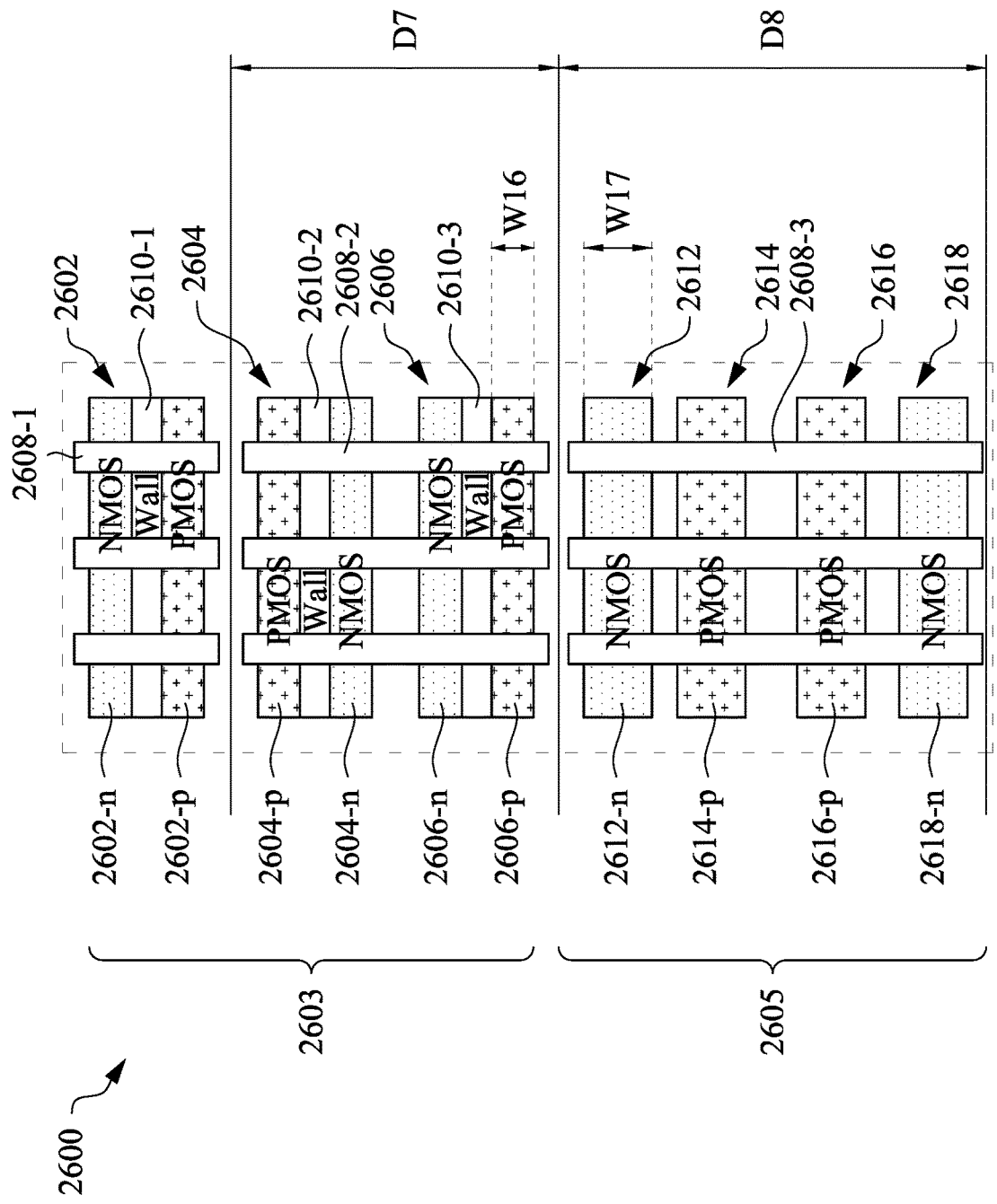

FIG. 26 illustrates a top-view of a semiconductor device structure 2600 of FIG. 23 in accordance another embodiment. In this embodiment, the semiconductor device structure 2600 includes a first circuit 2602, a second circuit 2604, a third circuit 2606, a fourth circuit 2612, a fifth circuit 2614, a sixth circuit 2616, and a seventh circuit 2618 disposed on a chip or substrate 2601. In some embodiments, the first circuit 2602, the second circuit 2604, and the third circuit 2606 are disposed at a first region 2603, and the fourth circuit 2612, the fifth circuit 2614, the sixth circuit 2616, and the seventh circuit 2618 are disposed at a second region 2605 of the substrate 2601. The first region 2603 and the second region 2605 are adjacent to each other. The first, second, and third circuits 2602, 2604, 2606 may be a forksheet transistor, such as the forksheet transistor 182 discussed above with respect to FIG. 18, and the fourth, fifth, sixth, and seventh circuits 2612, 2614, 2616, 2618 may be nanosheet transistors, such as the nanosheet transistors 184, 186 discussed above with respect to FIGS. 18 and 18-1. The first circuit 2602 has a NMOS device 2602-n and a PMOS device 2602-p extending outwardly from opposing sides a dielectric wall 2610-1, the second circuit 2604 has a NMOS device 2604-n and a PMOS device 2604-p extending outwardly from opposing sides a dielectric wall 2610-2, and the third circuit 2606 has a NMOS device 2606-n and a PMOS device 2606-p extending outwardly from opposing sides a dielectric wall 2610-3.

In some embodiments, the PMOS device 2602-p of the first circuit 2602 is disposed adjacent to the PMOS device 2604-p of the second circuit, and the NMOS device 2604-n of the second circuit 2604 is disposed adjacent to the NMOS device 2606-n of the third circuit 2606. The PMOS device 2606-p of the third circuit 2606 is disposed adjacent to NMOS device 2612-n of the fourth circuit 2612, the PMOS device 2614-p of the fifth circuit 2614 is disposed between the NMOS device 2612-n of the fourth circuit 2612 and the PMOS device 2616-p of the sixth circuit 2616, and the NMOS device 2618-n of the seventh circuit 2618 is disposed adjacent to the PMOS device 2616-p of the sixth circuit 2616. In some embodiments, three gate structures 2608-1 are disposed to extend in a direction perpendicular to the direction of the dielectric walls 2610-1 across the first circuit 2602 in a way that the NMOS device 2602-n and the PMOS device 2602-p of the first circuit 2602 are electrically connected. Three gate structures 2608-2 are disposed to extend in a direction perpendicular to the direction of the dielectric walls 2610-2 across the second and third circuits 2604, 2606 in a way that the PMOS device 2604-p and NMOS device 2604-n of the second circuit 2604, and the NMOS device 2606-n and the PMOS device 2606-p of the third circuit 2606 are electrically connected. Three gate structures 2608-3 are disposed to across the NMOS device 2612-n of the fourth circuit 2612, the PMOS device 2614-p of the fifth circuit 2614, the PMOS device 2616-p of the sixth circuit 2616, and the NMOS device 2618-n of the seventh circuit 2618 are electrically connected.

In some embodiments, the gate structures 2608-1, 2608-2, and 2608-3 have the same gate pitch and the same gate length. Additionally or alternatively, the gate structures 2608-3 may have different gate length than the gate structures 2608-1, 2608-2, such as those discussed above with respect to FIG. 22. The first and second circuits 2602, 2604 may have the same channel width as the third circuit 2606, and the fifth, sixth, and seventh circuits 2614, 2616, 2618 may have the same channel width as the fourth circuit 2612. In some embodiments, the PMOS device 2606-p of the third circuit 2606 has a channel width W16, and the NMOS device 2612-n of the fourth circuit 2612 has a channel width W17 that is greater than the channel width W16. In some embodiments, the channel width W17 is about 1.5 to about 10 times greater than the channel widths W16.

In some embodiments, the first, second, and third circuits 2602, 2604, 2606 at the region 2603 have a cell height D7 (along gate routing direction), and the fourth, fifth, sixth, and seventh circuits 2612, 2614, 2616, 2618 at the region 2605 have a cell height D8 that is greater than the cell height D7. In some embodiments, the cell height D7 is about 1.3 to about 5 times greater than the cell height D8. In some embodiments, the cell height D8 is about 1.3 to about 5 times greater than the cell height D7.

Various embodiments described herein offer multiple advantages over the state-of-art technology. A methodology of Design-Technology Co-Optimization (DTCO) based on the requirement of high speed/current application is achieved through Non-forksheet (or nanosheet) transistor circuits and Forksheet transistor circuits with high density on the same chip. According to embodiments of the present disclosure, a single chip having a nanosheet transistor circuits and forksheet transistor circuits with varied channel widths for high-speed/high power consumption applications and low-power consumption applications/high-density device requirements, respectively. The nanosheet transistor circuits have a sheet width (channel width) that is about 1.5 to about 10 times greater than the sheet width of the forksheet transistor circuits, and gate structures extending across the nanosheet transistor circuits may be the same or greater than the gate structures extending across the forksheet transistor circuits. The size of the gate via contact and gate contact at the nanosheet transistor circuits are about 1.1 to about 1.5 times greater than that of the gate via contact and gate contact at the forksheet transistor circuits. These allow compatible process integration of the nanosheet transistor circuits and the forksheet transistor circuits. Since a single chip contains two different types of circuits for different speed/current requirements, the device performance, power efficiency, transistor density, and cost of semiconductor device structures involving logic, SRAM, analog, and I/O, etc. can be improved.

An embodiment is a semiconductor device structure. The semiconductor device structure includes a first dielectric wall, a plurality of first semiconductor layers vertically stacked and extending outwardly from a first side of the first dielectric wall, each first semiconductor layer has a first width, a plurality of second semiconductor layers vertically stacked and extending outwardly from a second side of the first dielectric wall, each second semiconductor layer has a second width, a plurality of third semiconductor layers disposed adjacent the second side of the first dielectric wall, each third semiconductor layer has a third width greater than the second width, a first gate electrode layer surrounding at least three surfaces of each of the first semiconductor layers, the first gate electrode layer having a first conductivity type, and a second gate electrode layer surrounding at least three surfaces of each of the second semiconductor layers, the second gate electrode layer having a second conductivity type opposite the first conductivity type.

Another embodiment is a semiconductor device structure. The semiconductor device structure includes a first forksheet transistor disposed at a first region of a substrate, the first forksheet transistor comprising a dielectric wall, a NMOS device disposed on a first side of the dielectric wall, a PMOS device disposed on a second side of the dielectric wall, and a plurality of first gate structures extending across the NMOS device, the dielectric wall, and the PMOS device. The semiconductor device structure also includes a first nanosheet transistor disposed at a second region of the substrate, the first nanosheet transistor comprising a PMOS device, a second nanosheet transistor disposed at the second region of the substrate, the second nanosheet transistor comprising a NMOS device, wherein the first and second nanosheet transistors have a channel width that is about 1.5 times or greater than a channel width of the first forksheet transistor. The semiconductor device structure further includes a plurality of second gate structures extending across the PMOS device of the first nanosheet transistor and the NMOS device of the second nanosheet transistor.

A further embodiment is a method. The method includes forming first, second, and third fin structures from a substrate, wherein the first fin structure includes a first plurality of semiconductor layers, the second fin structure includes a second plurality of semiconductor layers, and the third fin structure includes a third plurality of semiconductor layers, and wherein each of the first, second, and third plurality of semiconductor layers comprises first semiconductor layers and second semiconductor layers, wherein the first fin structure is separated from the second fin structure by a first distance, and the second fin structure is separated from the third fin structure by a second distance, wherein the first fin structure has a first width, and the third fin structure has a second width that is about 1.5 to about 10 times greater than the first width. The method includes forming a dielectric wall between the first fin structure and the second fin structure, forming an insulating material between the second and third fin structures, selectively removing the second semiconductor layers of the first, second, and third plurality of semiconductor layers, forming an interfacial layer (IL) to surround at least three surfaces of the first semiconductor layers of the first and second fin structures as well as entire exposed surface of the first semiconductor layers of the third fin structure, forming a first gate electrode layer over the IL of the first fin structure, and forming a second gate electrode layer over the IL of the second and third fin structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
    a first dielectric wall;
    a plurality of first semiconductor layers vertically stacked and extending outwardly from a first side of the first dielectric wall, each first semiconductor layer has a first width;
    a plurality of second semiconductor layers vertically stacked and extending outwardly from a second side of the first dielectric wall, each second semiconductor layer has a second width, and the second width is different than the first width;
    a plurality of third semiconductor layers disposed adjacent the second side of the first dielectric wall, each third semiconductor layer has a third width greater than the second width;
    a first gate electrode layer surrounding at least three surfaces of each of the first semiconductor layers, the first gate electrode layer having a first conductivity type; and
    a second gate electrode layer surrounding at least three surfaces of each of the second semiconductor layers, the second gate electrode layer having a second conductivity type opposite the first conductivity type.

2. The semiconductor device structure of claim 1, wherein the third width is about 1.5 to about 10 times greater than the second width.

3. The semiconductor device structure of claim 1, wherein the first dielectric wall has a wall width that is less than the first width or the second width.

4. The semiconductor device structure of claim 1, further comprising:
    an interfacial layer surrounding the at least three surfaces of each of the first semiconductor layers, the at least three surfaces of each of the second semiconductor layers, and at least three surfaces of each of the third semiconductor layers; and
    a high-k dielectric layer surrounding the interfacial layer.

5. The semiconductor device structure of claim 4, wherein the interfacial layer disposed between each of the first semiconductor layers and the high-k dielectric layer has a first thickness, and the interfacial layer disposed between each of the third semiconductor layers and the high-k dielectric layer has a second thickness greater than the first thickness.

6. The semiconductor device structure of claim 1, wherein two adjacent second semiconductor layers have a first space and two adjacent third semiconductor layers have a second space greater than the first space.

7. The semiconductor device structure of claim 1, further comprising:

a second dielectric wall disposed adjacent the first side of
the first dielectric wall;
a plurality of fourth semiconductor layers vertically
stacked and extending outwardly from a first side of the
second dielectric wall, each fourth semiconductor layer
has a fourth width; and
a plurality of fifth semiconductor layers vertically stacked
and extending outwardly from a second side of the
second dielectric wall, wherein the fifth semiconductor
layers are disposed between the first semiconductor
layers and the fourth semiconductor layers, and each
fifth semiconductor layer has a fifth width.

8. The semiconductor device structure of claim 7, wherein the fourth width is greater than the fifth width.

9. A semiconductor device structure, comprising:
a first forksheet transistor disposed at a first region of a
substrate, the first forksheet transistor comprising:
a dielectric wall;
an n-type metal oxide semiconductor (NMOS) device
disposed on a first side of the dielectric wall;
a p-type metal oxide semiconductor (PMOS) device
disposed on a second side of the dielectric wall; and
a plurality of first gate structures extending across the
NMOS device, the dielectric wall, and the PMOS
device;
a first nanosheet transistor disposed at a second region of
the substrate, the first nanosheet transistor comprising
a second PMOS device;
a second nanosheet transistor disposed at the second
region of the substrate, the second nanosheet transistor
comprising a second NMOS device, wherein the first
nanosheet transistor and the second nanosheet transistor have a channel width that is about 1.5 times or
greater than a channel width of the first forksheet
transistor; and
a plurality of second gate structures extending across the
second PMOS device of the first nanosheet transistor
and the second NMOS device of the second nanosheet
transistor.

10. The semiconductor device structure of claim 9, wherein each of the first gate structures has a first gate pitch and each of the second gate structures has a second gate pitch greater than the first gate pitch.

11. The semiconductor device structure of claim 9, wherein the NMOS device of the first forksheet transistor has a first channel width, the PMOS device of the first forksheet transistor has a second channel width, the second PMOS device of the first nanosheet transistor has a third channel width greater than the first channel width and the second channel width, and the second NMOS device of the second nanosheet transistor has a fourth channel width greater than the first channel width and the second channel width.

12. The semiconductor device structure of claim 9, wherein the NMOS device of the first forksheet transistor has a first channel width, the PMOS device of the first forksheet transistor has a second channel width greater than the first channel width, the second PMOS device of the first nanosheet transistor has a third channel width greater than the first channel width and the second channel width, and the second NMOS device of the second nanosheet transistor has a fourth channel width greater than the first channel width and the second channel width.

13. The semiconductor device structure of claim 11, further comprising:
a second forksheet transistor disposed at the first region of
the substrate, the second forksheet transistor comprising:
a second dielectric wall;
a third NMOS device disposed on a first side of the
second dielectric wall of the second forksheet transistor; and
a third PMOS device disposed on a second side of the
second dielectric wall of the second forksheet transistor.

14. The semiconductor device structure of claim 13, wherein the third NMOS device of the second forksheet transistor has a fifth channel width greater than the second channel width of the PMOS device of the first forksheet transistor.

15. The semiconductor device structure of claim 13, further comprising:
a third nanosheet transistor disposed at the second region
of the substrate, the third nanosheet transistor comprising a fourth PMOS device; and
a fourth nanosheet transistor disposed at the second region
of the substrate, the fourth nanosheet transistor comprising a fourth NMOS device, wherein the third
nanosheet transistor and the fourth nanosheet transistor
have a channel width that is about 1.5 times or greater
than the channel width of the first forksheet transistor.

16. The semiconductor device structure of claim 15, wherein the first forksheet transistor and the second forksheet transistor have a first cell height, and the first nanosheet transistor, the second nanosheet transistor, the third nanosheet transistor, and the fourth nanosheet transistor have a second cell height greater than the first cell height.

17. A method for forming a semiconductor device structure, comprising:
forming a first fin structure, a second fin structure, and a
third fin structure from a substrate, wherein the first fin
structure includes a first plurality of semiconductor
layers, the second fin structure includes a second plurality of semiconductor layers, and the third fin structure includes a third plurality of semiconductor layers,
and wherein each of the first plurality of semiconductor
layers, the second plurality of semiconductor layers,
and the third plurality of semiconductor layers comprises first semiconductor layers and second semiconductor layers,
wherein the first fin structure is separated from the
second fin structure by a first distance, and the
second fin structure is separated from the third fin
structure by a second distance,
wherein the first fin structure has a first width, and the
third fin structure has a second width that is about 1.5
to about 10 times greater than the first width;
forming a dielectric wall between the first fin structure
and the second fin structure;
forming an insulating material between the second fin
structure and the third fin structure;
selectively removing the second semiconductor layers of
the first plurality of semiconductor layers, the second
plurality of semiconductor layers, and the third plurality of semiconductor layers;
forming an interfacial layer (IL) to surround at least three
surfaces of the first semiconductor layers of the first fin
structure and the second fin structure as well as an
entire exposed surface of the first semiconductor layers
of the third fin structure, wherein the IL is deposited so
that the IL at the first fin structure and the second fin structure has a first thickness, and the IL at the third fin structure has a second thickness greater than the first thickness;

forming a first gate electrode layer over the IL of the first fin structure; and forming a second gate electrode layer over the IL of the second fin structure and the third fin structure.

18. The method of claim 17, wherein the second fin structure has a third width different than the first width.

19. The method of claim 17, further comprising:

forming a high-k dielectric layer over the IL prior to forming the first gate electrode layer.

20. The method of claim 17, wherein forming the dielectric wall comprises forming the dielectric wall to contact the first semiconductor layers of the first fin structure and the second fin structure.

* * * * *